United States Patent [19]
Elrod et al.

[11] Patent Number: 5,303,200
[45] Date of Patent: Apr. 12, 1994

[54] N-DIMENSIONAL MULTI-PORT MEMORY

[75] Inventors: Steven E. Elrod, Kent; John S. Jensen, Tacoma, both of Wash.

[73] Assignee: The Boeing Company, Seattle, Wash.

[21] Appl. No.: 907,715

[22] Filed: Jul. 2, 1992

[51] Int. Cl.$^5$ .................................................. G11C 8/00
[52] U.S. Cl. ................................. 365/230.05; 365/238
[58] Field of Search ............... 365/230.05, 238, 230.02, 365/189.02, 230.03, 230.01, 189.04

[56] References Cited

U.S. PATENT DOCUMENTS

| | | | |
|---|---|---|---|
| 2,942,239 | 6/1960 | Eckert, Jr. et al. | 340/174 |
| 4,106,109 | 8/1978 | Fassbender | 365/238 |
| 4,509,043 | 4/1985 | Mossaides | 340/721 |
| 4,535,439 | 8/1985 | Satoh et al. | 369/275 |
| 4,570,236 | 2/1986 | Rebel et al. | 364/900 |
| 4,610,004 | 9/1986 | Moller et al. | 365/230 |
| 4,623,990 | 11/1986 | Allen et al. | 365/189 |
| 4,641,282 | 2/1987 | Ounuma | 365/189 |
| 4,691,295 | 9/1987 | Erwin | 365/238 |
| 4,720,819 | 1/1988 | Pinkham | 365/238 |
| 5,157,775 | 10/1992 | Sanger | 365/230.05 |

OTHER PUBLICATIONS

Overman, Timothy L., et al., "Image Processing Architecture Development," Boeing Aerospace Company disclosure document, pp. 1-8.

Primary Examiner—Eugene R. LaRoche
Assistant Examiner—A. Zarabian

[57] ABSTRACT

A three dimensional memory enabling both pixel and bit slice data to be stored and retrieved through different ports. A memory circuit (30) is divided into a lower memory block (32a) and an upper memory block (32b). Each memory block is organized into 256 rows ×16 groups (pixel planes) of eight columns (bit planes). Eight bits of pixel data are stored at a selected row and pixel plane of the upper or lower memory block, and sixteen bits of pixel data are stored at a selected row and bit plane of the upper or lower memory block. Address bits determine the location of pixel data and bit slice data. A bit plane port is used to access data in the bit slice format and another port is used to access data in the pixel format. Bit slice data input through the bit plane port and stored in the memory circuit can be read as pixel data through the pixel port, and vice versa. By enabling image data stored in the memory circuit to be accessed as either pixel or bit slice data, retrieval of the image data in either representation is achieved without the need for an external serial-to-parallel or parallel-to-serial converter, greatly enhancing the speed by which the data stored in one representation is retrieved in the other.

28 Claims, 14 Drawing Sheets

N-DIMENSIONAL MULTI-PORT MEMORY

FIELD OF THE INVENTION

This invention generally pertains to an integrated circuit for electronically storing data, and more specifically, to a memory device having a plurality of ports for accessing the data stored therein.

BACKGROUND OF THE INVENTION

One of the more important applications for integrated circuit memory devices is in the field of image processing. In an image processing system, a video sensing device (e.g., an array of charge coupled devices or a video camera) typically produces image data as an analog signal that is digitized by an analog-to-digital (A-D) converter and stored in a memory circuit in a pixel representation, as a two-dimensional array of gray scale values. Efficient processing of the image data is often best implemented on bit-serial arithmetic units (processors), which offer the advantages of variable sized arguments and a small number of input/output pins. The bit-serial processors require the image data to be read one bit (bit plane) at a time so that their input is a serial data stream, starting with the least significant bit (LSB) and proceeding through the most significant bit (MSB) by taking successive bit slices of the pixels. By using one bit-serial processor for each column of the image, one row of a bit plane image can be read at a time, as each bit-serial processor simultaneously receives a bit of the same significance (e.g., the fifth bit of all of the pixels on a row). Unfortunately, use of bit-serial processors requires that information comprising the image data be converted from the pixel representation to the bit plane representation, and then back to pixel representation, for display on a monitor.

For example, the pixel representation of image data may comprises a 128×128 array of eight-bit pixels. In contrast, the corresponding bit plane representation of this image data would be eight bit planes, each including a 128×128 array of one-bit data.

Clearly, the pixel representation and the bit plane representation of image data are different formats that require accessing the bits of the image data differently. Thus, a typical image processing system uses a number of serial-to-parallel and parallel-to-serial converters to convert image data between the two representations. Provision of a memory circuit that eliminates the need for such conversions and allows both pixel and bit slice data to be stored and retrieved as parallel data would thus contribute a significant improvement to the current state of the art by enhancing the speed with which the image data are stored and accessed, particularly for the bit plane representation.

Presently, memory devices are not commercially available that can access data stored in memory selectively in either a pixel or a bit plane representation. In U.S. Pat. No. 4,641,282, a memory system is disclosed for use in a display or printing system for processing graphics data. The memory system has a plurality of memory planes, each provided with an operation circuit that performs logical operations on the picture data stored in each memory plane and simultaneously writes the results in the memory planes. However, there is no provision for reading the memory planes as gray scale data, i.e., there is no access to the data in a parallel format, in pixel representation.

In U.S. Pat. No. 4,623,990, a single-array memory includes a storage cell providing dual read/write access via either an "A" side or a "B" side. Thus, the memory cell allows the same data to be accessed through two ports, but only in the same format or representation. The idea is extended in U.S. Pat. No. 4,610,004, which discloses an integrated circuit having two read ports and two write ports, again allowing data to be accessed in the same format or representation through multiple ports; the device enables data to be accessed at different addresses according to the phase of an "A" side or "B" side clock.

Bit slice data are written to a plurality of memory devices and then accessed in pixel representation in U.S. Pat. No. 4,509,043. One or more bit planes selected to constitute a group define a "surface," and similarly, another group of one or more bit planes defines another surface. The priority of the surfaces is identified so that one surface appears to overlie the other. Multiple ports are not provided in the memory device and therefore, access of the image data selectively in either bit plane or pixel representation through different ports is precluded.

A multi-dimensional parallel storage device is disclosed in U.S. Pat. No.4,570,236. An address computing circuit is provided for each multi-dimensional element produced by scanning an image according to a scanning pattern, enabling the recursive computation of a storage element or a reference array point for a linear storing function to occur after shifting of a window in the displayed image. The data are processed as vectors, allowing multiple storage elements to be simultaneously accessed in vector form, but through only one part.

Advantages of the present invention over the prior art in permitting data stored in an integrated circuit memory circuit to be accessed selectively in bit plane or pixel representation through different ports will be apparent from the attached drawings and the Description of the Preferred Embodiment that follow.

SUMMARY OF THE INVENTION

In accordance with the present invention, a memory circuit is provided in which data are accessed as if stored in an array of at least three dimensions. The circuit includes a plurality of memory elements, each storing at least one bit of data. Each of a plurality of address busses conveys addresses for specific memory elements that are organized in one of a plurality of sets of parallel memory planes in the array. Each set of the parallel memory planes is orthogonal to other sets of parallel memory planes. Data port means are operative to convey data to and from memory elements in the memory planes selected by the addresses conveyed on the address busses. The data port means store and retrieve data from the memory elements that are organized in different orthogonal sets of parallel memory planes. Multiplexing means control access of the data port means to the memory elements in accordance with the addresses supplied on the address busses and are operative to effect storage and retrieval of data from the memory elements in orthogonal sets of the memory planes.

In one preferred form of the invention, there are two orthogonal sets of memory planes and at least two ports. The location of each memory element in the array is then defined by a row, a column, and a bit plane in which each memory element is disposed. The data port means convey data to and from selected memory elements that are at locations defined by row and column addresses, and to and from memory elements that are at locations defined by row and bit plane addresses. At least one port of the data port means comprises a pixel port and at least another port of the data port means comprises a bit plane port. The multiplexing means are further operative to allow a number, p, of memory elements comprising a pixel to be accessed for storage or retrieval through the pixel port, and a number, b, of memory elements, each comprising a bit plane element to be accessed for storage or retrieval through the bit plane port.

In one form of the invention, data stored and retrieved from memory elements addressed in either of the orthogonal sets of memory planes are transferable through the data port means in a parallel data stream. The memory elements are preferably divided between a plurality of separate blocks, the multiplexing means including addressing means for multiplexing the separate blocks. The memory circuit can thereby access the data at an enhanced speed, compared to prior art devices.

DETAILED DESCRIPTION OF THE PREFERRED EMBODIMENT

Figure 1:
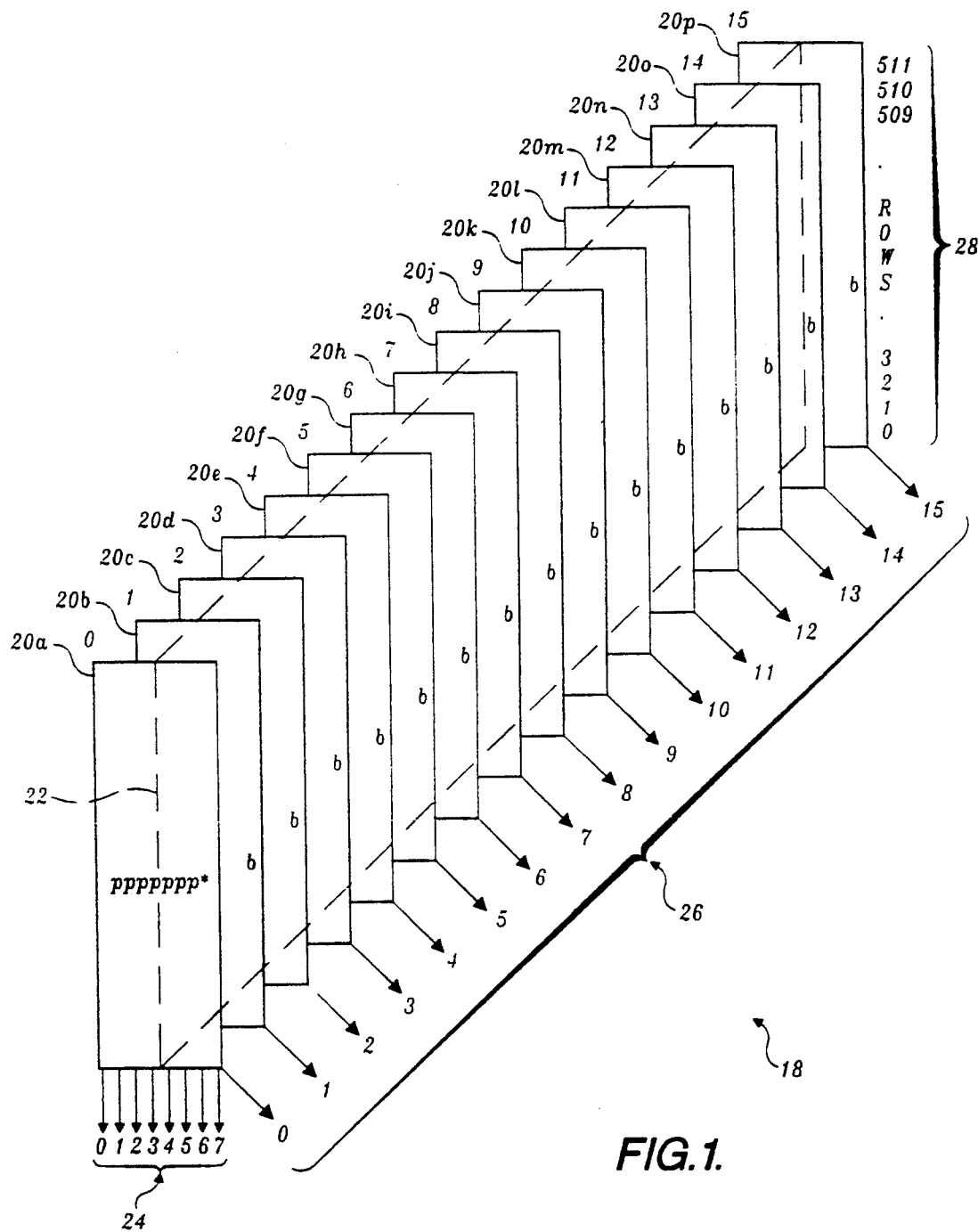
FIG. 1 is a schematic view of a virtual arrangement for a two port, three-dimensional memory in accordance with the present invention.

The virtual architecture of a first preferred embodiment of a dual port, three-dimensional memory array is generally illustrated at reference numeral 18 in FIG. 1. Although the memory elements comprising the dual port, three-dimensional memory array are not physically organized as visually represented in FIG. 1, the data are logically stored and accessed therein as if arranged in a plurality of pixel planes 20a through 20p, and in a plurality of bit planes 22 (only one of which is shown in an exemplary manner, to simplify the illustration) that are orthogonal to the pixel planes. Whether in pixel or bit slice representation, in the preferred embodiment, the data are preferably accessed in parallel format as if stored in one of 512 rows 28, eight bits at a time, as pixel data bits (p) through a pixel port 24, or 16 bits at a time, as bit slice data bits (b) through a bit plane port 26.

It will be apparent to those of ordinary skill in the art that the pixel data can alternatively comprise 4, 12, 24, 32, or some other number of bits per pixel. Similarly, the bit slice data may be stored and accessed in other than 16-bit increments. Furthermore, three-dimensional memory array 18 may include either fewer or more rows than the 512 rows of data used in the preferred embodiment. Such changes certainly impact upon the physical design of the dual port, three-dimensional memory as implemented in an integrated circuit (IC), but are clearly within the broader concept of this invention and achieved by simply modifying the preferred embodiment, as will be apparent to one of ordinary skill in the art, given the following description.

With reference to the virtual configuration of three-dimensional memory 18 shown in FIG. 1, the 512 rows×16 pixel planes are able to store 8,192 eight-bit pixels of data. However, the same data represent 4,096 bit slices (16 bits each). The pixels are addressed by the specific pixel plane 20a through 20p and the row 28 in which they are found using a 13-bit address. The bit slice data are addressed in terms of the bit plane (0 through 7) and the row 28 (ranging from 0 through 511) on which the data are stored, by a 12-bit address.

Unlike prior art memory devices, dual port, three-dimensional memory array 18 can store and read out data in either the pixel or bit slice representation, thereby eliminating the need for external bit-converters to process one representation into the other. As a result, a significant increase in data access and utilization speed is obtained compared to conventional memory circuits, which are used in connection with bit-serial converters, as described above in the Background of the Invention.

Figure 2:
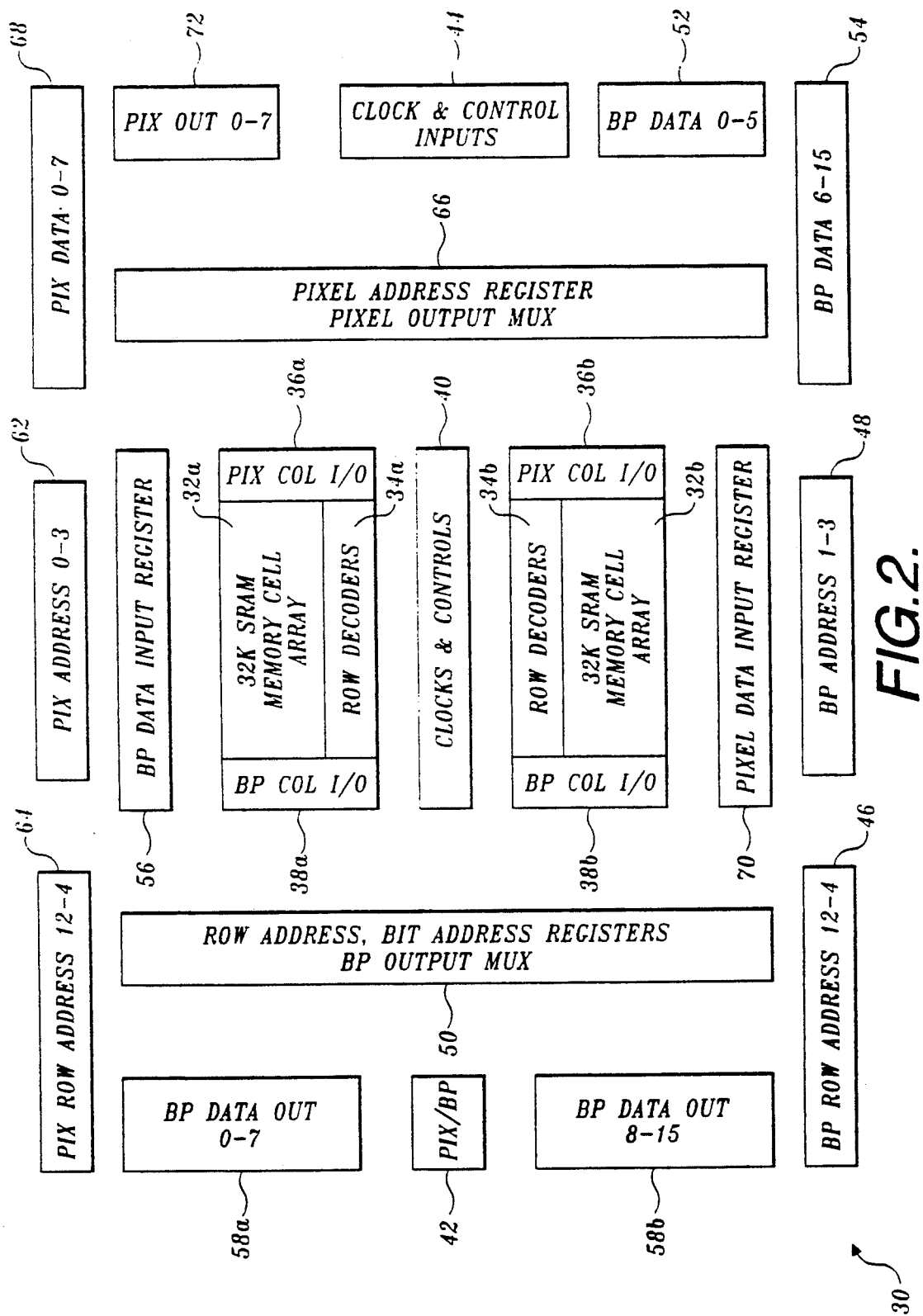
FIG. 2 is a block diagram of functional elements of the three-dimensional memory, as implemented in an integrated circuit for a preferred embodiment.

Turning now to FIG. 2, a block diagram illustrates the rough physical layout of the functional blocks of an IC implementation of the dual port, three-dimensional memory array in a memory circuit 30. In its preferred form, memory circuit 30 comprises an application specific integrated circuit (ASIC) that includes approximately 394,000 transistors. When operating in a pixel mode, it functions like a conventional 8 Kbyte random access memory (RAM) in which 8-bit pixels are stored, and when operating in a bit plane mode, it functions like a conventional 4K×16-bit static RAM that reads and writes 16-bit bit slices. Memory circuit 30 is preferably manufactured using a National Semiconductor TM 0.8 micron CMOS foundry process. The memory circuit was actually designed for the 1.0 micron process and then scaled down to the 0.8 micron process to achieve the desired speed for storing and accessing image data.

Substantial enhancements in speed, reduction in layout complexity, and shortened critical signal paths are obtained in the preferred embodiment of memory circuit 30 by using two generally conventional 32 K bit static random access memory (SRAM) arrays for data storage, including a lower memory block 32a and an upper memory block 32b. The terms "lower memory block" and "upper memory block" refer to the relative significant bits of the row address for data, the lower block being used to store data in the first 256 rows (0 through 255) and the upper block being used to store data in the second 256 rows (256 through 511). This arrangement enables a symmetrical distribution of data in each of the 32K bit memory blocks so that the data are stored or read as pixels through pixel column input-/output circuitry 36a/36b disposed at one end of the memory blocks, and as bit slices through bit plane input-/output circuitry 38a/38b disposed at the opposite end of each block. Row decoders 34a and 34b are disposed adjacent each of memory blocks 32a and 32b. A clocks and controls block 40 is disposed between the two SRAM memory blocks, providing the shortest possible signal path between the controls and the row and column decoders of blocks 34, 36, and 38.

The preferred embodiment of the dual port, three-dimensional memory implemented in memory circuit 30 does not permit the simultaneous access of data through the pixel and bit plane ports. However, it will be apparent to those of ordinary skill in the art that the preferred embodiment disclosed herein can readily be modified to permit simultaneous access of data through the pixel and bit plane ports. Instead, a pixel/bit plane signal input to a pixel/bp selector circuit 42 determines the mode that is active at any one time, both for writing and for reading data. External crystal controlled clock signals and control signals from an external source (such as a central processing unit-not shown) are input to a clock and control input block 44. Separate bit plane and pixel clocks are used in memory circuit 30 to allow the two modes to operate at different frequencies.

The 12-bit address required for selecting bit slice data during read and write operations is input through input buffers in blocks 46 and 48. Bits 12-4 of this address (the row address) is multiplied with bits 12-4 of the pixel address, controlled by the pixel/bp signal in block 50.

The multiplexed row address and bit slice addresses 1-3 are then stored in an address register, also in block 50. In addition, block 50 includes a bit plane output multiplexer. The first six bits of bit slice data are processed through a bit plane input port 52, and the remaining ten bits are processed through a bit plane input port 54. The bit slice data are stored in memory blocks 32a or 32b at memory cell locations determined by the multiplexed row address and the bit plane address (1-3) stored in the address register in block 50.

In a similar manner, during operation in the pixel mode, pixel data are stored or read from memory cells determined by a pixel address input to a block 62 (for address bits 0 through 3) and to a block 64 (for address bits 12 through 4). Pixel data are input through a pixel input port 68, for storage at the memory cell locations defined by the address input to a block 66. As explained below, multiplexed address bit 12 determines the specific memory block 32a or 32b at which the pixel or bit slice data are stored or retrieved.

Before storage in the specific memory cells selected by the address, bit slice data are processed through a bit plane data input register 56, and pixel data are processed through a pixel data input register 70. Bit plane data input register 56, pixel data input register 70, and address registers 50 and 66 include time delay circuits (not shown in FIG. 2) that provide an appropriate time delay so that all inputs (address and data) can have a zero hold time.

Bit slice data are output through a bit plane output port, which is divided between a block 58a for bits 0 through 7 and a block 58b for bits 8 through 15. During operation in the pixel mode, the pixel bits 0 through 7 are output through a pixel output port 72.

Figure 3:
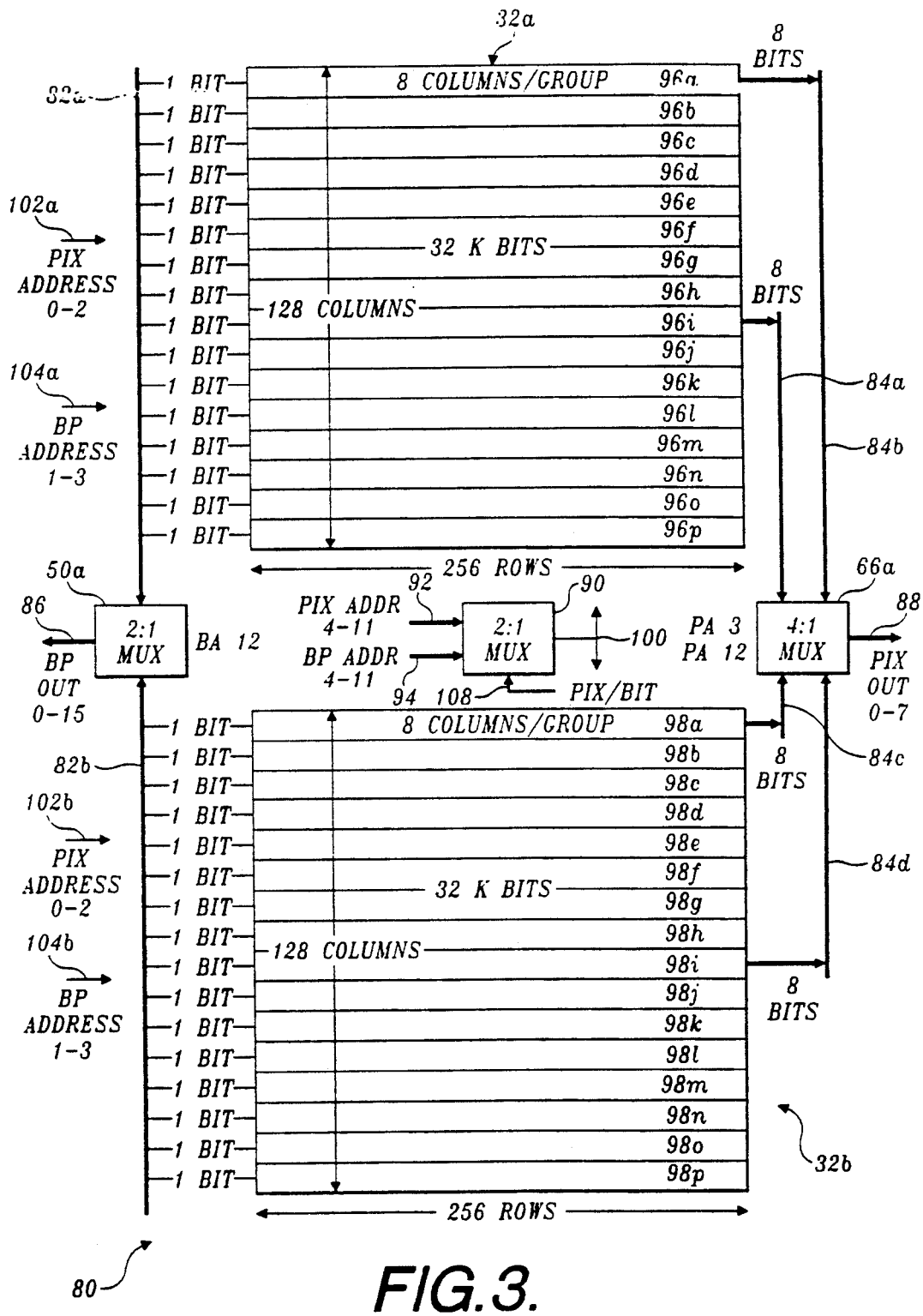
FIG. 3 is a schematic representation of a preferred embodiment of the three-dimensional memory, wherein two blocks of memory cells (each 128 columns×256 rows) are included, providing a total memory of 64K bits.

In FIG. 3, the organization of data stored in memory blocks 32a and 32b is shown. Lower memory block 32a includes 16 groups of columns 96a through 96p, each group having eight columns organized into 256 rows of memory cells. Similarly, upper memory block 32b comprises 16 groups 98a through 98p, with eight columns per group, also organized into 256 rows of memory cells. Thus, each memory block includes 128 columns×256 rows.

The 13-pixel address bits are split between bits 0 through 3 and bits 4 through 12. The first four bits 0 through 2 are input over lines 102a and 102b to memory blocks 32a and 32b, respectively, and bits 4 through 11 of the pixel address are input over lines 92 to a first input of a 2:1 multiplexer block 90. Likewise, the first three bits 1 through 3 of the bit plane address are input over lines 104a and 104b, and the remaining bits 4–11 of the bit plane address are input on lines 94 to a second input of 2:1 multiplexer 90. Depending upon whether the bit plane or pixel mode is selected, 2:1 multiplexer block 90 selects one of the sets of address lines 92 or 94 to determine the row address. The row address is conveyed on lines 100 to both memory blocks 32a and 32b.

Since the same row address is input to both of the memory blocks, one of the two memory blocks must be selected for a read or write operation in either the pixel or bit plane mode. Accordingly, pixel address bit 12 is input to a 4:1 multiplexer block 66a, causing it to select the lower or upper memory block 32a or 32b. In addition, 4:1 multiplexer block 66a receives pixel address bit three, enabling it to determine whether the pixel data should be read or written from or to a left or right portion of the selected lower or upper memory block. In a similar fashion, the 12th bit of the bit plane address is input to a 2:1 multiplexer circuit 50, causing it to select between memory blocks 32a and 32b for storage or retrieval of bit slice data. Thus, although the row in each of the memory cell blocks is selected based on bits 4 through 11, other bits in the address determine whether memory cells in the lower or upper memory blocks are being selected, and in the case of pixel data, whether the pixel data are to be written to or read from among the left eight groups (96a through 96h)/(98a through 98h) of the lower or upper memory block, respectively, or written to or read from among the right eight groups (96i through 96p)/(98i through 98p) of the lower or upper memory blocks, respectively.

Figure 4:
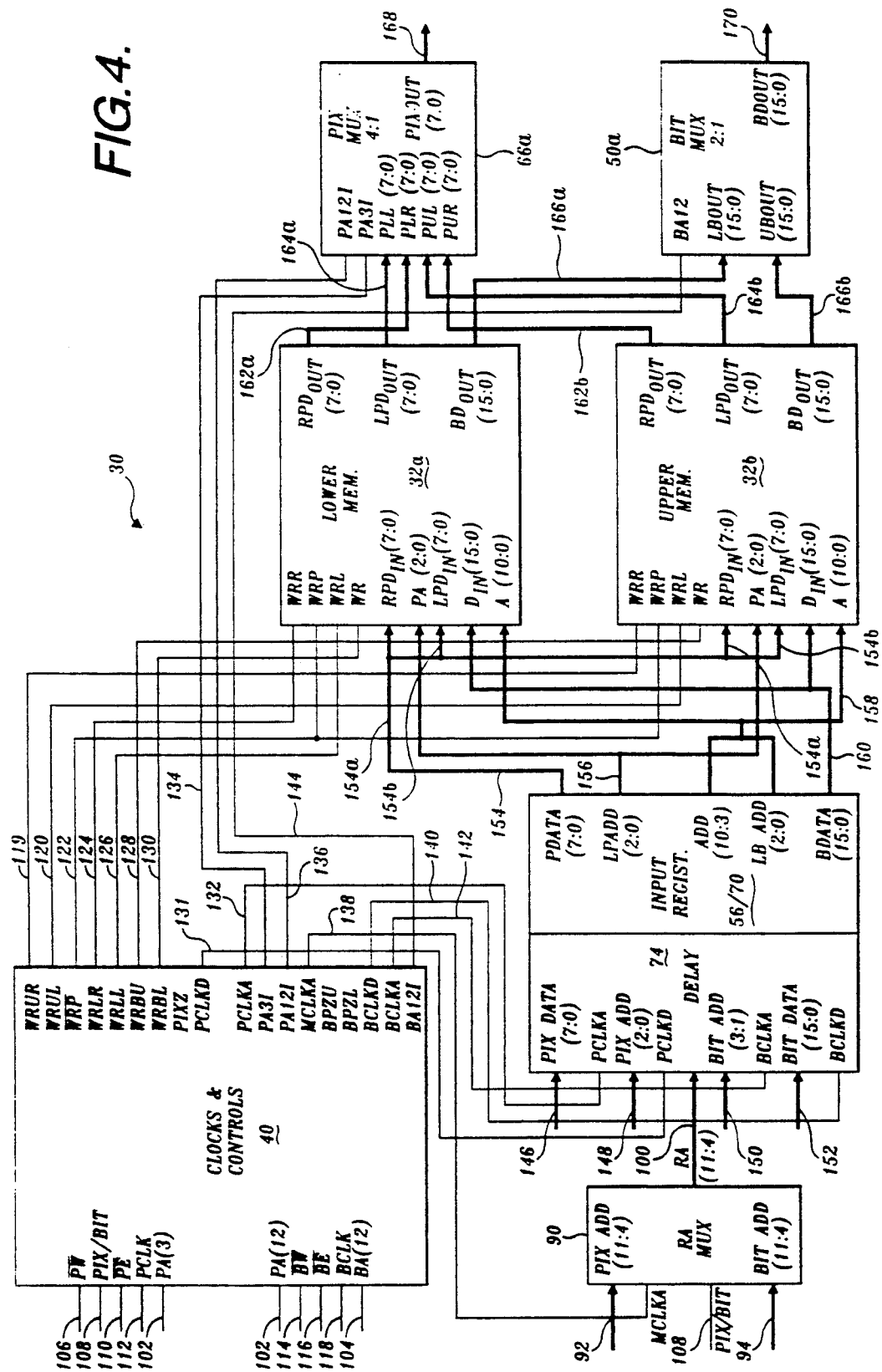
FIG. 4 is a schematic block diagram illustrating the interconnection of components comprising the memory circuit.

Turning now to FIG. 4, the relationship between clock and controls block 40 and the other portions of circuit 30 is shown. Clocks and controls block 40 includes a number of input and output terminals, identified by acronyms in Table 1, as follows:

TABLE 1

| ACRONYM | DEFINITION | SIGNAL LINE(S) |
|---|---|---|
| $\overline{PW}$ | Pixel Write Enable - Bar | 106 |
| PIX/BIT | Pixel/Bit Plane Mode Select | 108 |
| $\overline{PE}$ | Pixel Mode Enable - Bar | 110 |
| PCLK | Pixel Clock | 112 |
| PA3 | Pixel Address Bit Three | 102 |
| PA12 | Pixel Address Bit Twelve | 102 |
| $\overline{BW}$ | Bit Plane Write Enable - Bar | 114 |
| $\overline{BE}$ | Bit Plane Mode Enable - Bar | 116 |
| BCLK | Bit Plane Clock | 118 |
| BA12 | Bit Plane Address Bit Twelve | 104 |
| WRUR | Write Upper Right Portion Memory | 119 |
| WRUL | Write Upper Left Portion Memory | 120 |
| $\overline{WRP}$ | Write Pixel Enable - Bar | 122 |
| WRLR | Write Lower Right Portion Memory | 124 |
| WRLL | Write Lower Left Portion Memory | 126 |
| WRBU | Write Bit Plane Upper Memory | 128 |
| WRBL | Write Bit Plane Lower Memory | 130 |
| PIXZ | Hi-Impedance (on Pixel Ports) | N/A |
| PCLKD | Pixel Data Clock Signal | 131 |
| PA3I | Pixel Address Bit Three | 134 |
| PCLKA | Pixel Address Clock Signal | 132 |
| PA12I | Pixel Address Bit Twelve | 136 |
| MCLKA | Multiplexer Clock Signal | 138 |
| BPZU | Hi-Impedance (on Bit Plane Ports) | N/A |
| BPZL | Hi-Impedance (on Bit Plane Ports) | N/A |
| BCLKD | Bit slice data Clock Signal | 140 |
| BCKLD | Bit Plane Address Clock Signal | 142 |
| BA12I | Bit Plane Address Bit Twelve | 144 |
| PIX ADD | Pixel Address | 92 |
| BIT ADD | Bit Plane Address | 94 |
| PIX DATA | Pixel Data | 146 |
| BIT DATA | Bit slice data | 152 |
| LPADD | Lowest Bits Pixel Address | 156 |
| ADD | Row Address | 158 |
| BDATA | Bit slice data | 160 |
| PDATA | Pixel Data | 154 |
| $RPD_{IN}$ | Right Portion Input Pixel Data | 154a |
| $LPD_{IN}$ | Left Portion Input Pixel Data | 154b |
| $D_{IN}$ | Bit Slice Input Data | 160 |
| $RPD_{OUT}$ | Right Pixel Output Data | 162a |
| $LPD_{OUT}$ | Left Pixel Output Data | 164a |
| $BD_{OUT}$ | Bit Slice Output Data | 166b |

As is conventional, the specific bit or range of bits comprising a signal is identified in the figures by a number enclosed in parentheses. For example, pixel address bit 3, which is conveyed on one of lines 102 to the input of clocks and controls 40, is identified by "PA(3)." Another of lines 102 conveys pixel address bit 12, identified by "PA(12)."

The 12th bit of the bit plane address is input to clocks and controls block 40 over line 104. Also input are a pixel write enable signal, which is input on a line 106; a pixel/bit plane mode select signal, input on a line 108; a pixel mode enable signal, conveyed on a line 110, and a pixel clock signal, which is input on a line 112. A bit plane write enable signal is input to clocks and controls block 40 on a line 114, and a bit plane mode enable signal is input on a line 116. A bit plane clock signal is applied on a line 118. Clocks and controls block 40 uses these clock and input signals to develop various control signals, including the following: a pixel write enable signal for the right portion of upper memory block 32b, conveyed on a line 119; a pixel write enable signal for the left portion of memory block 32b, conveyed on a line 120; an inverted logic write pixel enable signal (inverted logic signals are represented by use of a bar over the identifying acronym, e.g., $\overline{WRP}$) conveyed on a line 122; a pixel write enable signal for the right portion of, lower memory block 32a, conveyed on a line 124; a pixel write enable signal for the left portion of lower memory block 32a conveyed on a line 126; a bit plane write enable signal for upper memory block 32b, conveyed on a line 128; and, a bit plane write enable signal for lower memory block 32a, conveyed on a line 130.

In addition, the following control signals are provided by clocks and controls block 40: a pixel address clock signal is output on a line 132; pixel address bits 3 and 12 are output on lines 134 and 136, respectively; a multiplexer clock signal is output on a line 138, which is connected to 2:1 multiplexer 90; a bit slice data clock signal is output on a line 140; a bit plane address clock signal is conveyed by a line 142; and bit plane address bit twelve is output on a line 144. Clocks and controls block 40 also generates three other signals labeled PIXZ, BPZU, and BPZL. During each clock cycle, these three signals are applied to the pixel and bit plane output ports, respectively, any time that the corresponding port is not in use for output of data, thereby causing the port to have a high impedance (in excess of 10 megohms). The pixel and bit plane ports are tri-state, having an output for each bit that is either a logic level 0, a logical level 1, or a high impedance.

The mode under which circuit 30 operates is determined primarily by the PIX/BIT signal input to clocks and controls block 40 on line 108. To enable the pixel mode, the pixel enable signal applied on line 110 must be low. Furthermore, if pixel data are being written to a specified address within the dual port, three-dimensional memory, the pixel write enable signal applied via line 106 must also be low. Similarly, although operation in the bit plane mode is selected by the signal applied to the PIX/BIT input, a logic level 0 bit plane enable signal on line 116 is also required to enable the bit plane mode. When the bit plane mode is selected, a logic level 0 bit plane write enable signal applied over line 114 enables the writing of bit slice data to a selected address in the dual port, three-dimensional memory. In the event that both the pixel enable and bit plane enable signals are at a logic level 0, the signal applied to the PIX/BIT input of clocks and controls block 40 controls the mode of operation. The relationships between these control signals are tabulated in Table 2, as follows: the mode selected by the control signals (result) occurs on the rising edge of the pixel clock or bit plane clock signal:

TABLE 2

| CONTROL SIGNALS | | | | | | | |
|---|---|---|---|---|---|---|---|
| PIX/BP | $\overline{PE}$ | $\overline{PW}$ | $\overline{BW}$ | $\overline{BE}$ | RESULT | PIX PORTS | BP PORTS |
| 0 | X | X | 0 | 0 | WRITE BIT SLICE DATA | HI-IMP | HI-IMP |
| 0 | X | X | 1 | 0 | READ BIT SLICE DATA | HI-IMP | VALID |

TABLE 2-continued

| | CONTROL SIGNALS | | | | | | |
|---|---|---|---|---|---|---|---|
| PIX/BP | $\overline{PE}$ | $\overline{PW}$ | $\overline{BW}$ | $\overline{BE}$ | RESULT | PIX PORTS | BP PORTS |
| 0 | X | X | X | 1 | MEMORY CIRCUIT DISABLED | HI-IMP | HI-IMP |
| 1 | 1 | X | X | X | MEMORY CIRCUIT DISABLED | HI-IMP | HI-IMP |
| 1 | 0 | 0 | X | X | WRITE PIXEL DATA | HI-IMP | HI-IMP |
| 1 | 0 | 1 | X | X | READ PIXEL DATA | VALID | HI-IMP |

In Table 2, X indicates a "don't care" state, and VALID indicates that after the specified time has passed from the rising edge of the clock, the data on the output bus are valid. HI-IMP indicates that the port has a high-impedance state.

The row address of either pixel or bit slice data that are to be written or read from the dual port, three-dimensional memory is set up by row address multiplexer 90, which determines the row in memory circuit 30 to or from which the pixel data are written or retrieved based on bits 11 through 4 of the pixel address, and the row address to or from which bit slice data are to be written or retrieved based on bit plane address bits 11 through 4 on lines 94. Depending upon the mode in which dual port, three-dimensional memory is operating as defined by the PIX/BIT signal input to multiplexer 90 over line 108, either the pixel row address or bit plane row address is selected. The row address is input to a delay block 74, which provides the required hold time for the address. According to the specifications for the preferred embodiment of the dual port, three-dimensional memory, a typical hold time of 0 nanoseconds is required for the address, port, input data, write enable, and mode, prior to the rising edge of each pixel or bit plane clock signal. A set up time of 10 ns is required for these same signals. Delay block 74 provides the necessary delay of the address and pixel or bit slice data to achieve this specified hold time. The delay time is developed by a plurality of NAND gates (not shown) that are connected in series, each NAND gate decreasing the required hold time for each of the signals propagating through delay block 74 by the delay through the NAND gate. These signals include: pixel data bits 7 through 0, applied via lines 146; the first three pixel address bits 2 through 0, applied over lines 148; the row address, applied over lines 100; the bit plane address bits 3 through 1, conveyed over lines 150; and the bit slice data (bits 15 through 0), carried on lines 152. After the appropriate delay is applied by delay block 74, these signals are passed to input registers 56/70. Input registers 56/70 set up the address for storing pixel and bit slice data. The addresses for pixel and bit slice data are divided into two parts. The least significant bits 2 through 0 of the pixel address are supplied from input registers on lines 156, and input to both lower memory block 32a and upper memory block 32b. Similarly, the bit plane addresses are divided between a lower bit plane address comprising the first three least significant bits 2 through 0 and the row addresses comprising bits 10 through 3, both portions of the address being output on lines 158 to lower and upper memory blocks 32a and 32b.

The 8 bits of pixel data (bits 7 through 0) that are output from input registers 56 and 70 for storage in the lower and upper memory blocks are conveyed on lines 154 and distributed in parallel to pixel data input ports for the right and left portions of the lower and upper memory blocks. Sixteen bits of bit slice data are input in parallel to the lower and upper memory blocks through lines 160. Input of either the pixel or bit slice data to both the lower and upper memory blocks in parallel does not result in writing the same data to the two different memory blocks; PA3, PA12 or BA12 determine whether the lower or upper memory blocks 32a or 32b that will be used to store the data, or select the memory block from which the data will be read.

While operating in the pixel mode, pixel data selected from the right portion of the lower memory block are output on pixel data bus 162a, while pixel data output from the left portion of the lower memory block are output on pixel data bus 164a. Similarly, pixel data from the right portion of the upper memory block are output on pixel data bus 162b, and pixel data from the left portion of the upper memory block are output on pixel data bus 164b. Since there are four possible sources of pixel data at the selected row during a pixel read operation, 4:1' pixel multiplexer 66a selects the appropriate portion of the memory for output of the pixel data based upon the PA3 and PA12 of the pixel address, which are input to the pixel multiplexer on lines 134 and 136, respectively. Details of 4:1 pixel multiplexer 66a are described below. The selected pixel data are output from the pixel multiplexer on pixel data bus 168.

For a given row address, there are two possible sources of bit slice data, the lower or upper memory blocks, and the appropriate source is selected by 2:1 bit plane multiplexer 50a in response to bit plane address bit BA12. The selected bit slice data are conveyed to multiplexer circuit 50a from the lower memory block on bit slice data bus 166a and from the upper memory block on bit slice data bus 166b. From 2:1 bit plane multiplexer circuit 50a, the selected bit slice data are output on bit slice data bus 170.

Figure 5:
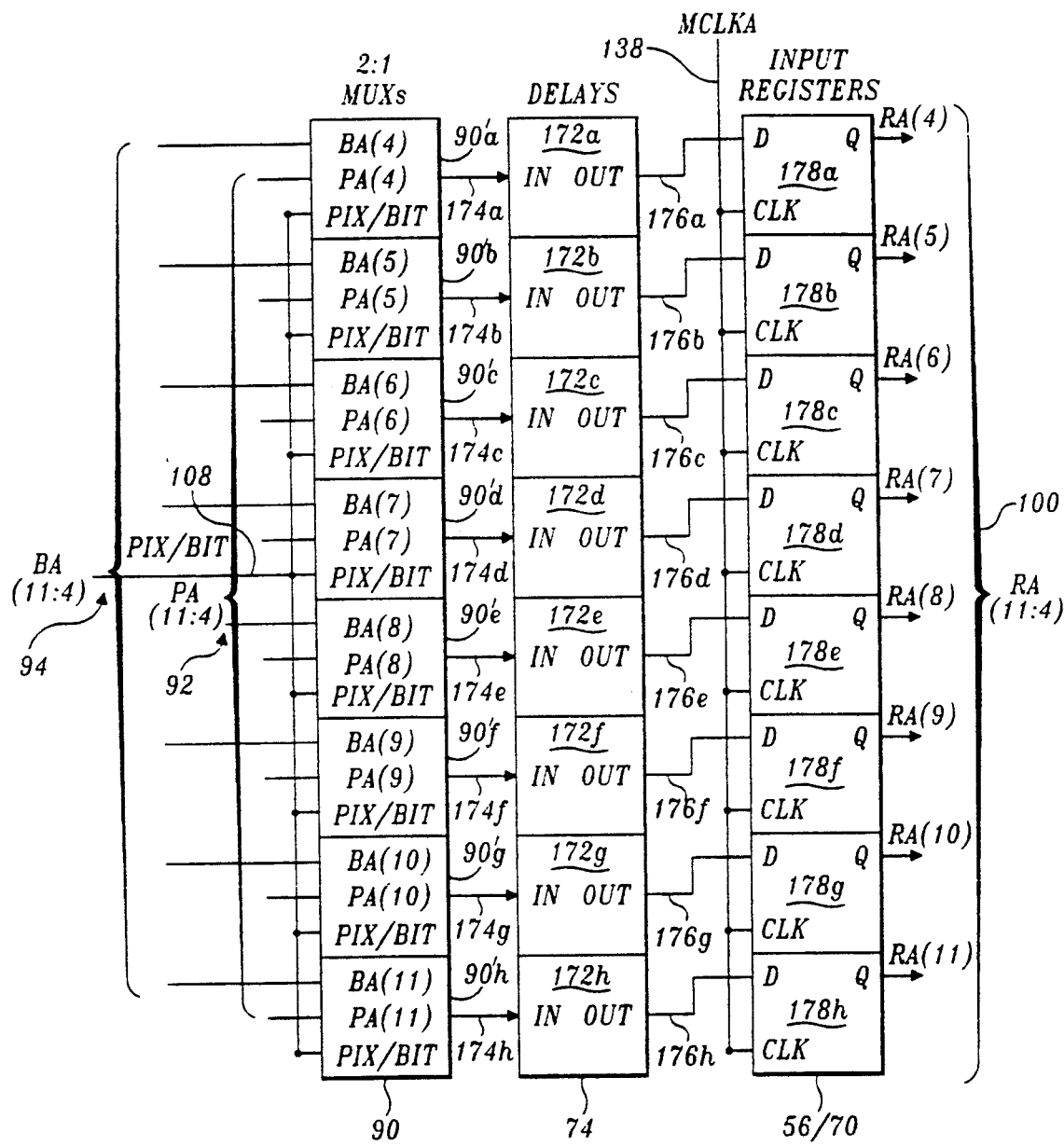
FIG. 5 is a schematic block diagram of an input circuit for pixel and bit slice data.

Turning now to FIG. 5, additional details of row address multiplexer 90, delay block 74, and input registers 56/70 are shown. Each of the bit plane row address bits are applied to separate 2:1 multiplexers 90'a through 90'h over bit plane address bus 94 during operation in the bit plane mode, and the pixel row address (bits 11 through 4) are applied over pixel address bus 92. Operation in the pixel or bit plane mode is determined by the PIX/BIT signal on line 108, and in response thereto, 2:1 multiplexers 90'a through 90'h select bits 11 through 4 of the pixel or bit plane row address for input to delay circuits 172a through 172h, respectively, on lines 174a through 174h. After the appropriate time delay is applied by delay circuits 172, the selected row addresses are conveyed to input registers 56/70 over address bus lines 176a through 176h. Input registers 56/70 comprise D flip-flops 178a through 178h, which are clocked by the multiplexer clock signal on line 138. With each rising edge of the multiplexer clock pulse, the signal on the Q terminals of the D flip-flops change to the logic level on the D terminals, each registering one bit of the pixel or bit plane row address (bits 11 through 4); the selected row address bits are output on lines 100.

Figure 6:
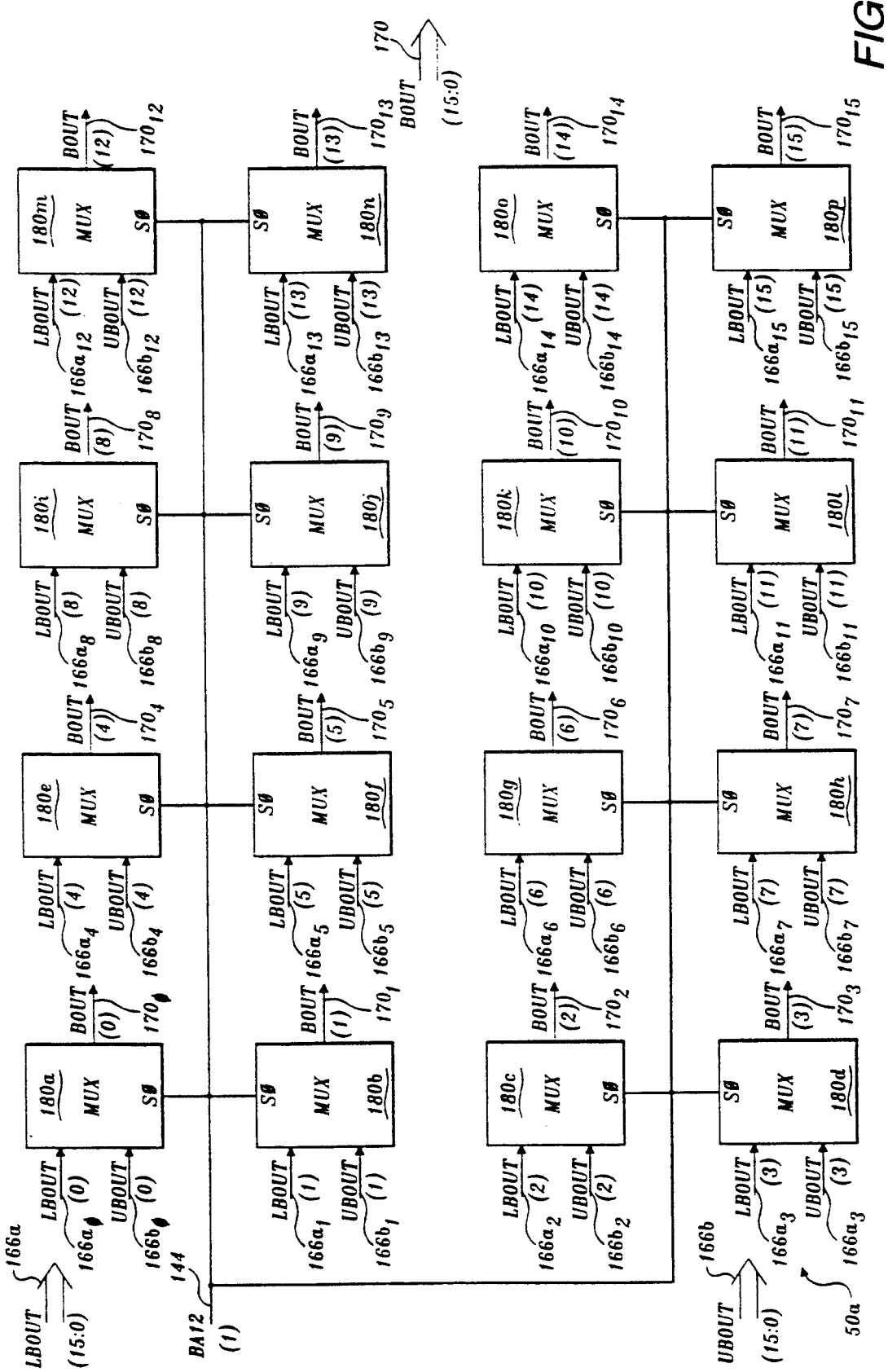
FIG. 6 is a schematic block diagram of a multiplexer circuit for the bit slice data, which is used to select between the "upper" and "lower" blocks of memory cells.

FIG. 6 shows details of 2:1 multiplexers 180a through 180p, which comprise 2:1 bit plane multiplexer circuit 50a. Each of 16 bits of bit slice data conveyed on bit slice data bus 166a from the lower memory block and on bit slice data block 166b from the upper memory block are input to a different one of bit plane multiplexers 180. For example, bits 0 from the lower and upper memory blocks, conveyed on bit slice data bus lines 166$a_0$ and 166$b_0$, respectively, are input to a multiplexer 180a. The remaining bits 1 through 15 from each memory block are input to the other 2:1 multiplexers 180b through 180p, respectively. The bit plane address bit 12 that is input over bit plane address bus line 144 to an S0 terminal on each of multiplexers 180 determines whether the lower or upper memory blocks are selected. The selected bit slice output data are conveyed on lines 170$_0$ through lines 170$_{15}$. If bit plane address bit 12 is a logic level 1, each of the data bits output from the upper memory block 32b are selected for output on bit slice data bus 170.

Figure 7:
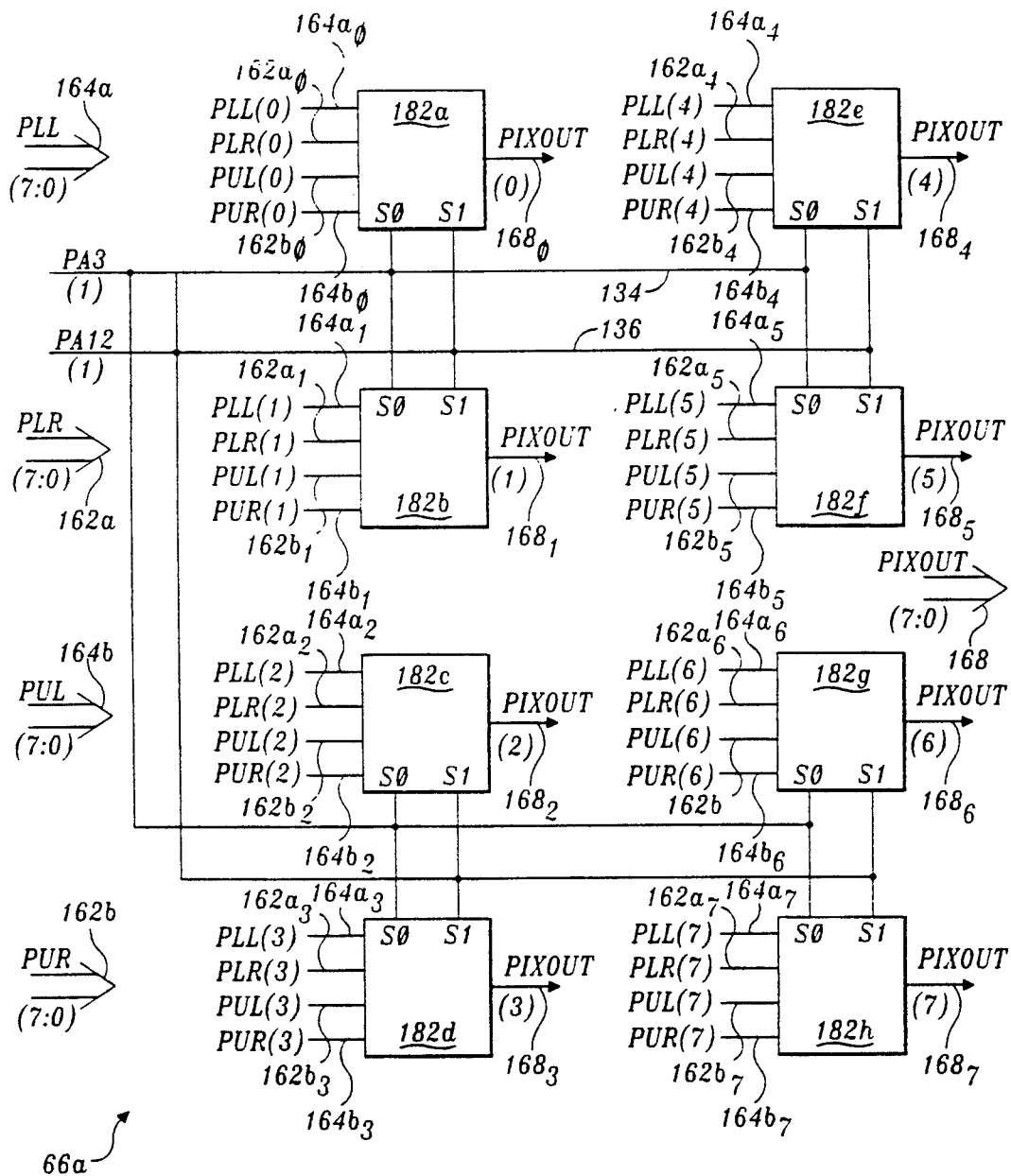
FIG. 7 is a schematic diagram of a four-way multiplexer circuit used to select the "left" or "right" portion of the "upper" or "lower" blocks of memory cells for writing or reading pixel data.

Pixel output data from the left or right portions of the lower or upper memory blocks are selected in an analogous manner, by 4:1 pixel multiplexer circuit 66a, as shown in FIG. 7. The 4:1 pixel multiplexer circuit comprises eight four-input multiplexers 182a through 182h, each of which receives a different one of the eight bits comprising the four pixels stored in the left and right portions of the lower and upper memory blocks at its four input terminals. For example, the eight bits of pixel data retrieved from the left portion of the lower memory block are conveyed on pixel data bus 164a, each bit being input to a separate 4:1 multiplexer 182. Bit 0 of a pixel stored in the left portion of the lower memory block is input to 4:1 multiplexer 182a on pixel data bus line 164$a_0$. Bit 0 of the pixel stored in the right portion of the lower memory block is input to that same multiplexer on pixel data bus line 162$a_0$. Bit 0 of the corresponding pixels stored in the right and left portions of upper memory block 32b are input on pixel data bus lines 162$b_0$ and 164$b_0$, respectively. In a similar manner, the corresponding remaining bits 1 through 7 of the four pixels in the right and left portions of the lower and upper memory blocks are input to the other 4:1 multiplexers 182b through 182h on other lines of pixel data busses 162a, 162b, and 164a, and 164b.

Since there are four inputs to each 4:1 multiplexer 182, two control bits are required to determine the pixel data bit output from each 4:1 multiplexer 182. A terminal S0 on each 4:1 multiplexer 182 is thus connected to pixel address bus line 134 to receive the third pixel address bit PA3 used to select the left or right portion of one of the memory blocks. The twelfth pixel address bit PA12 conveyed on pixel address bus line 136 is connected to a terminal S1 on each of the 4:1 multiplexers and determines whether the lower or upper memory block is selected as a source of the pixel output data. The pixels stored in memory circuit 30 are thus selected based upon the pixel row address and the third and twelfth pixel address bits, the same row addresses being applied to the left and right portions at both of the upper and lower memory. However, to the user, it appears that a specific pixel is selected simply by specifying the row and pixel plane at which the pixel is stored.

Figure 8:
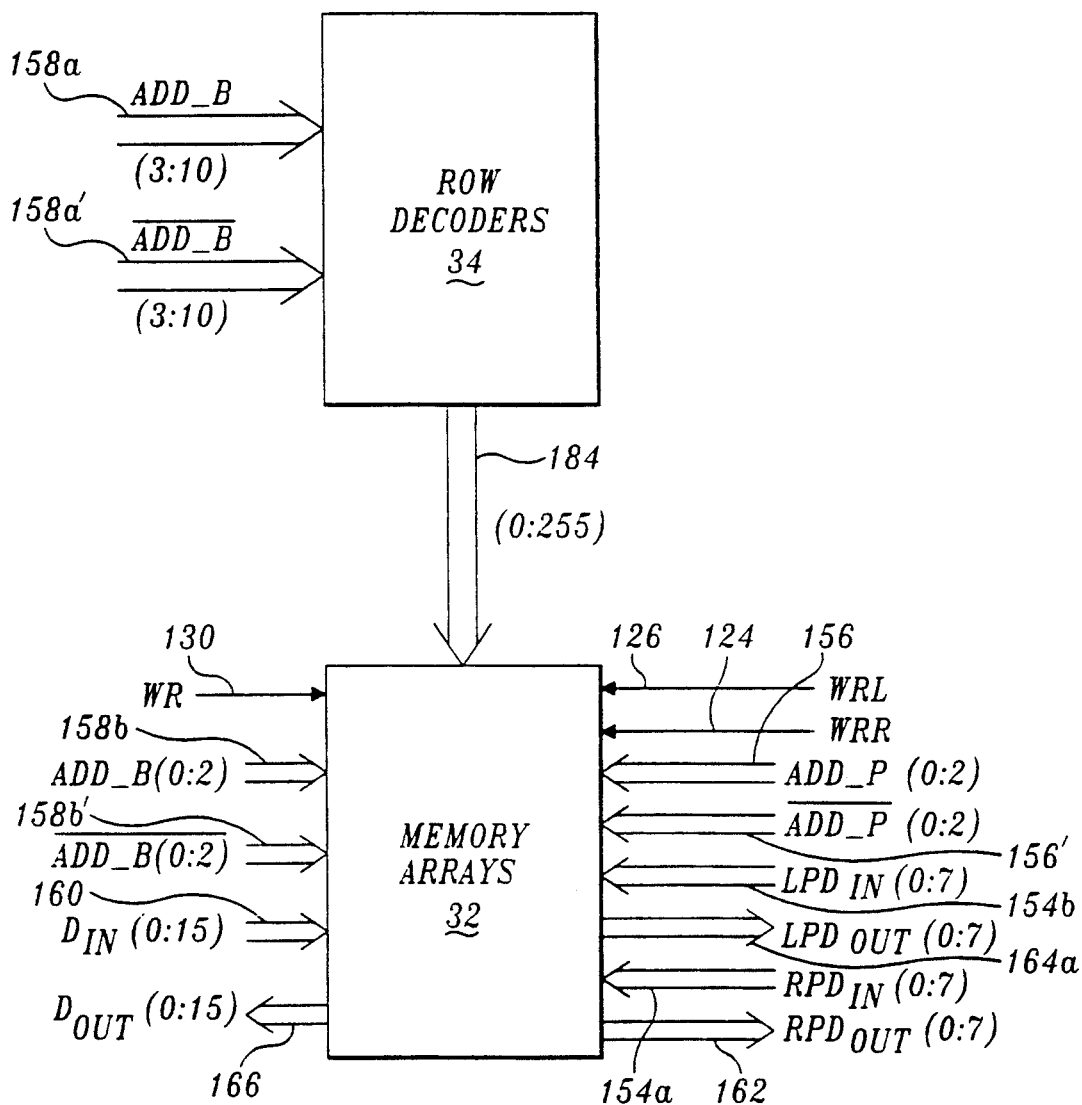
FIG. 8 is a schematic block diagram of the row decoder used for selecting a row of memory cells in each block of memory.

As shown in FIG. 8, selection of the appropriate row for use in either the pixel or bit plane mode is made by row decoder 34 in response to address bits 3 through 10 and their inverted complements, which are input to row decoder 34 on lines 158a and 158a', respectively. The eight address bits and their inverted complements cause one of 256 row decoders to produce a logic level 1 output that selects a specific row in each of the memory arrays 32. There are thus 256 lines 0 through 255 (collectively designated by reference numeral 184) that are connected to memory arrays 32 to select a specific row based on the pixel or bit plane row address. Three address bits and their inverted complement are input to memory blocks 32 on lines 158b and 158b', respectively, to select a specific column in each of 16 groups per memory block for writing or reading bit slice data. Similarly, bits 0 through 2 of the pixel address and their inverted complements are conveyed over lines 156 and 156' to memory blocks 32 to select a specific group of eight columns in the left and right portion of each memory block for writing or reading a pixel.

Figure 9:
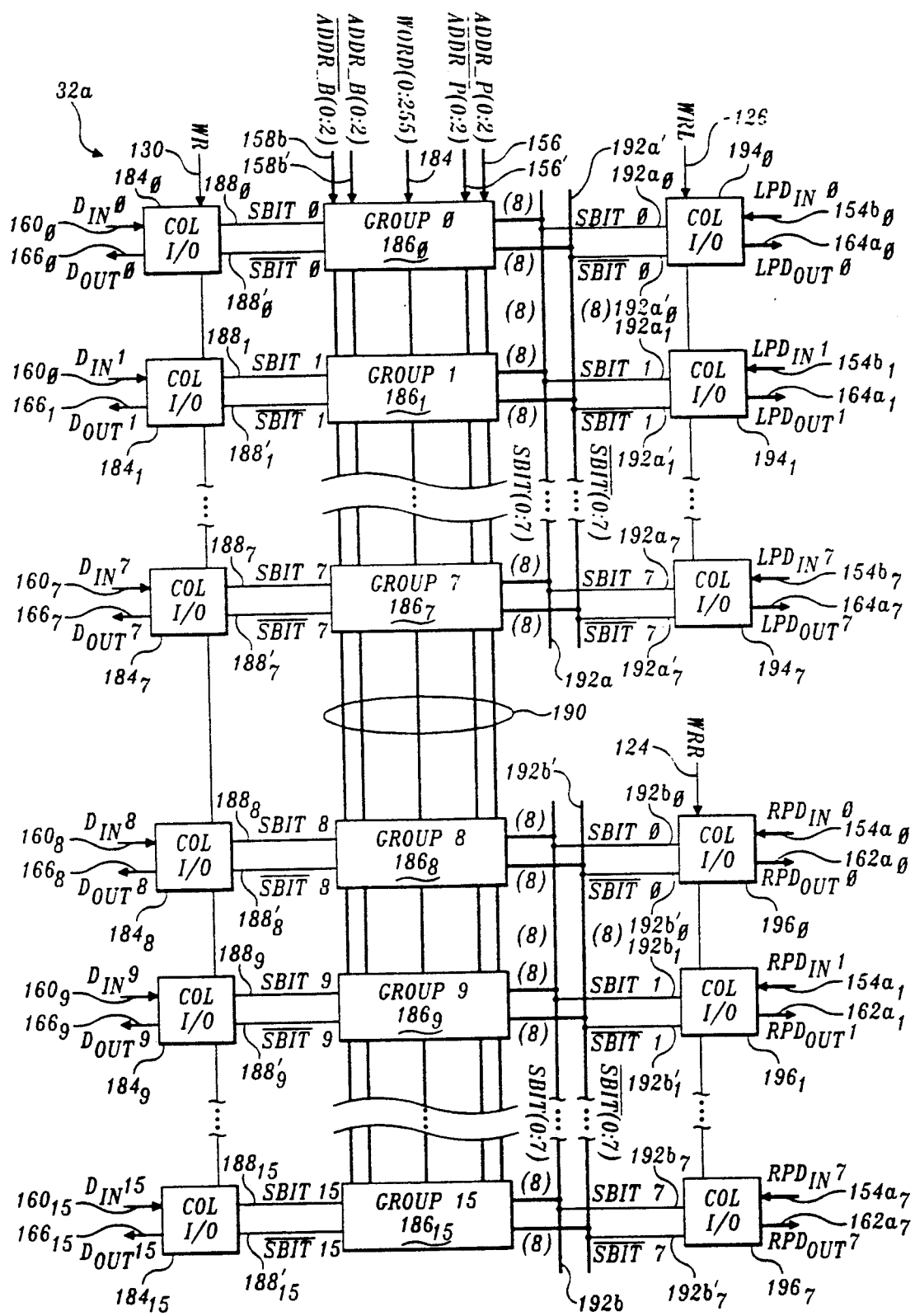
FIG. 9 is a more detailed block diagram illustrating the selection of memory cells for pixel and bit slice data for each block of memory.

In FIG. 9, further details of the circuitry used to select specific memory cells for writing or reading pixel or bit slice data are shown. In this Figure, only lower memory block 32a is referenced. However, it will be understood that upper memory block 32b is similarly configured. Furthermore, by way of example and to simplify the drawing, only groups 0, 1, 7, 8, 9, and 15 are illustrated and these groups are identified by reference numerals 186$_0$, 186$_1$, 186$_7$, 186$_8$, 186$_9$, and 186$_{15}$, respectively. For operation in both the pixel and bit plane modes, as noted above, the specific row selected for reading or writing data is designated by a logic level signal on one of 256 lines 184 that extend through all 16 groups of columns comprising lower memory array 32a. The bit plane address bits 0 through 2 and their corresponding complements that are input on bit plane address bus lines 158b and 158b', respectively, also extend through all 16 groups and are used to select a specific one of the eight columns in each of groups 0 through 15 for reading or writing bit slice data. Similarly, the pixel address bits 0 through 2 and their complement are conveyed on pixel address bus lines 156 and 156' through each of groups 0 through 15 to select a specific group 0 through 7 in the right portion of lower memory block 32a and a corresponding specific group among groups 8 through 15 in the left portion of the memory block for reading or writing pixel data.

During operation in the bit plane mode, bit slice data bits 0 through 15 are input on bit slice data bus lines 160$_0$ through 160$_{15}$ to column input/output blocks 184$_0$ through 184$_{15}$, respectively. The write enable signal applied on line 130 extends through each of the column input/output blocks 184, enabling the input data bits to be passed on to the column in each group that is determined by the first three bits of the address applied on bit plane address bus lines 158b and 158b' and to the selected row, as determined by lines 184. Bit slice data are conveyed for storage in lower memory block 32a over bit slice data bus lines 188$_0$ through 188$_{15}$, and their corresponding complements are conveyed over bit slice data bus lines 188'$_0$ through 188'$_{15}$. When bit slice data are being read from the memory circuit, i.e., when the bit plane mode is selected and the bit plane write enable signal on line 130 is not selected, the bit slice data at the selected columns in each group and at the selected row are output over bit slice data bus lines 188 and 188' to column input/output blocks 184. From the column input/output blocks, each bit of the bit slice data is conveyed over bit slice data bus lines 166$_0$ through 166$_{15}$.

During operation in the pixel mode, pixel data are written to specific cells in lower memory address block 32a in either the left or right portion, depending upon whether the pixel write enable signal on line 126 for the left portion, or the pixel write enable signal on line 124 for the right portion of lower memory block 32a is set. The eight bits of pixel data are input on pixel data bus lines $154b_0$ through $154b_7$ to column input/output blocks $194_0$ through $194_7$, respectively. The eight pixel bits and their corresponding complements are conveyed by pixel data bus lines $192a_0$ through $192a_7$ and $192a'_0$ through $192a'_7$, respectively, onto pixel data bus lines $192a$ and $192a'$, for input to each of the groups 0 through 7, which are identified by reference numbers $186_0$ through $186_7$. However, only one of these eight groups is selected as a location at which to write the pixel data (at one of the 256 rows) based upon the pixel address and its corresponding complement that are input on lines 156 and 156'. A similar selection process occurs with regard to pixel data input for the right portion of the lower memory block 32a, conveyed on pixel data bus lines $154a_0$ through $154a_7$.

Assuming that during operation in the pixel mode, neither write enable signals on lines 126 nor 124 (for the left and right portions of lower memory block 32a) are set, memory circuit 30 reads previously stored pixel data from the selected address. The pixel data from the selected memory location are conveyed over pixel data bus lines $192a/192a'$ for the left portion of the memory block and over lines $192b/192b'$ for the right portion. Specifically, bits 0 through 7 of the selected pixel data are conveyed on pixel data bus lines $192a_0$ through $192a_7$, respectively, and their complements are conveyed on lines $192a'_0$ and $192a'_7$, to column input/output blocks $194_0$ through $194_7$ for the left portion of the memory block, and over lines $192b_0/192b'_0$ through $192b_7/192b'_7$ to column input/output blocks $196_0$ through $196_7$ for the right portion of lower memory block 32a. The pixel data are then output to pixel output port 24 over pixel data bus lines $164a_0$ through $164a_7$ for the left portion of the memory block and over pixel data bus lines $162a_0$ through $162a_7$ for the right portion of the memory block.

Figure 10:
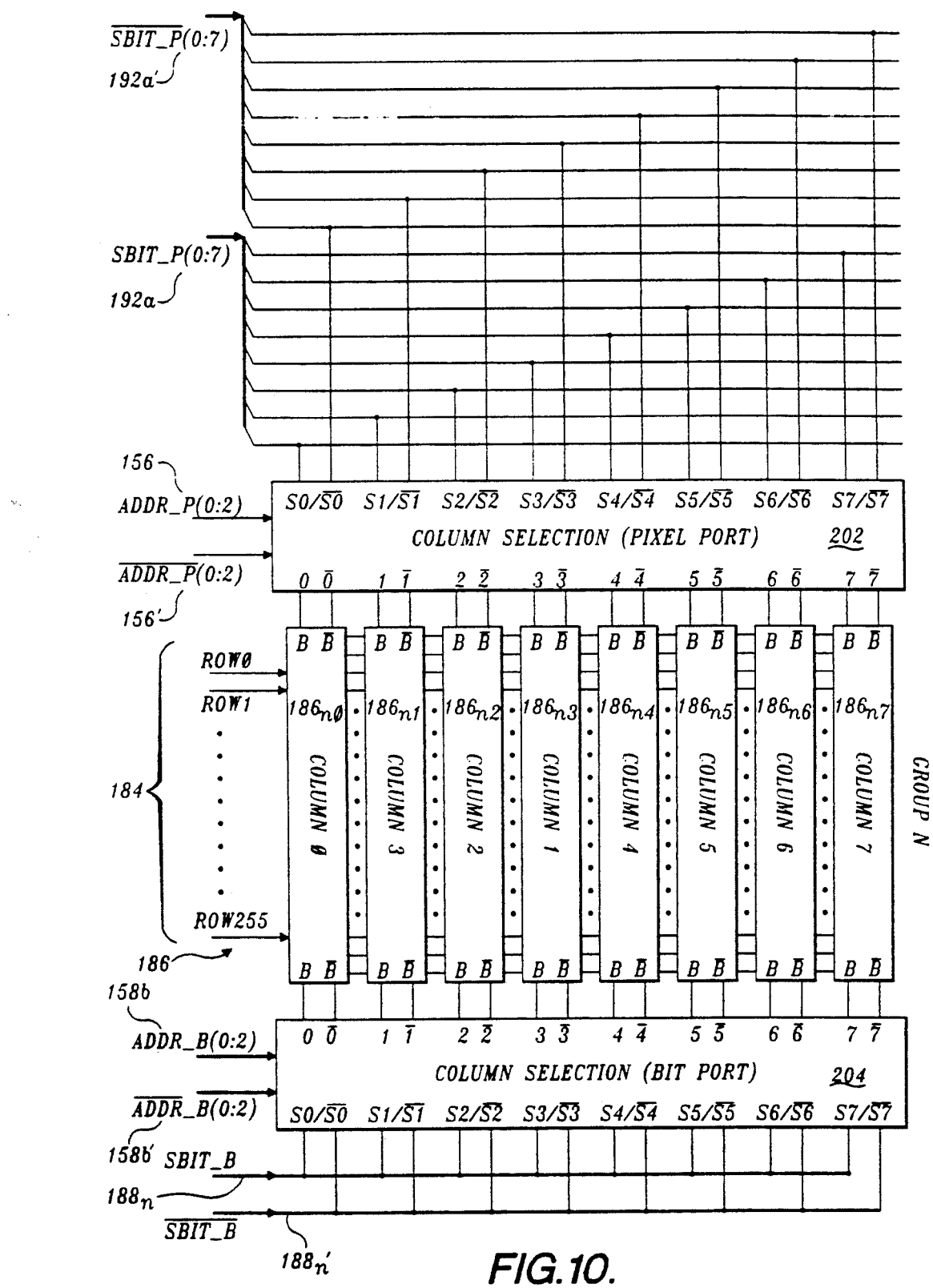
FIG. 10 is a schematic diagram of the memory block and column selection circuitry for the pixel and bit slice data.

FIG. 10 illustrates details of row and column selection during operation in the pixel or bit plane mode, for an exemplary group N—one of the 16 groups of eight columns comprising the lower memory block 32a. As explained above, pixel address bits 156/156' include three bits 0 through 2 that are used to select a specific one of the 16 groups for either a pixel read or write operation. The row in which the pixel is read or written in group N is defined by the signals on the row select signal on lines 184 that is high. When pixel data are read from the memory, all columns $186_{n0}$ through $186_{n7}$ in the desired group N are selected at the row determined by the signals on lines 184. The selected group thus corresponds to the pixel plane at which a pixel is to be stored or read at the specified row coordinate.

During operation in the bit plane mode, the first three bits on the bit plane address 0 through 2 (and their complements on lines 158b and 158b') select one of columns 0 through 7 in group N as the bit plane, and the row defined by the signals on lines 184 determines the specific bit of the bit slice data (and its corresponding complement) that are input or output on bit plane data bus lines $188_n$ and $188'_n$.

Figure 11A:
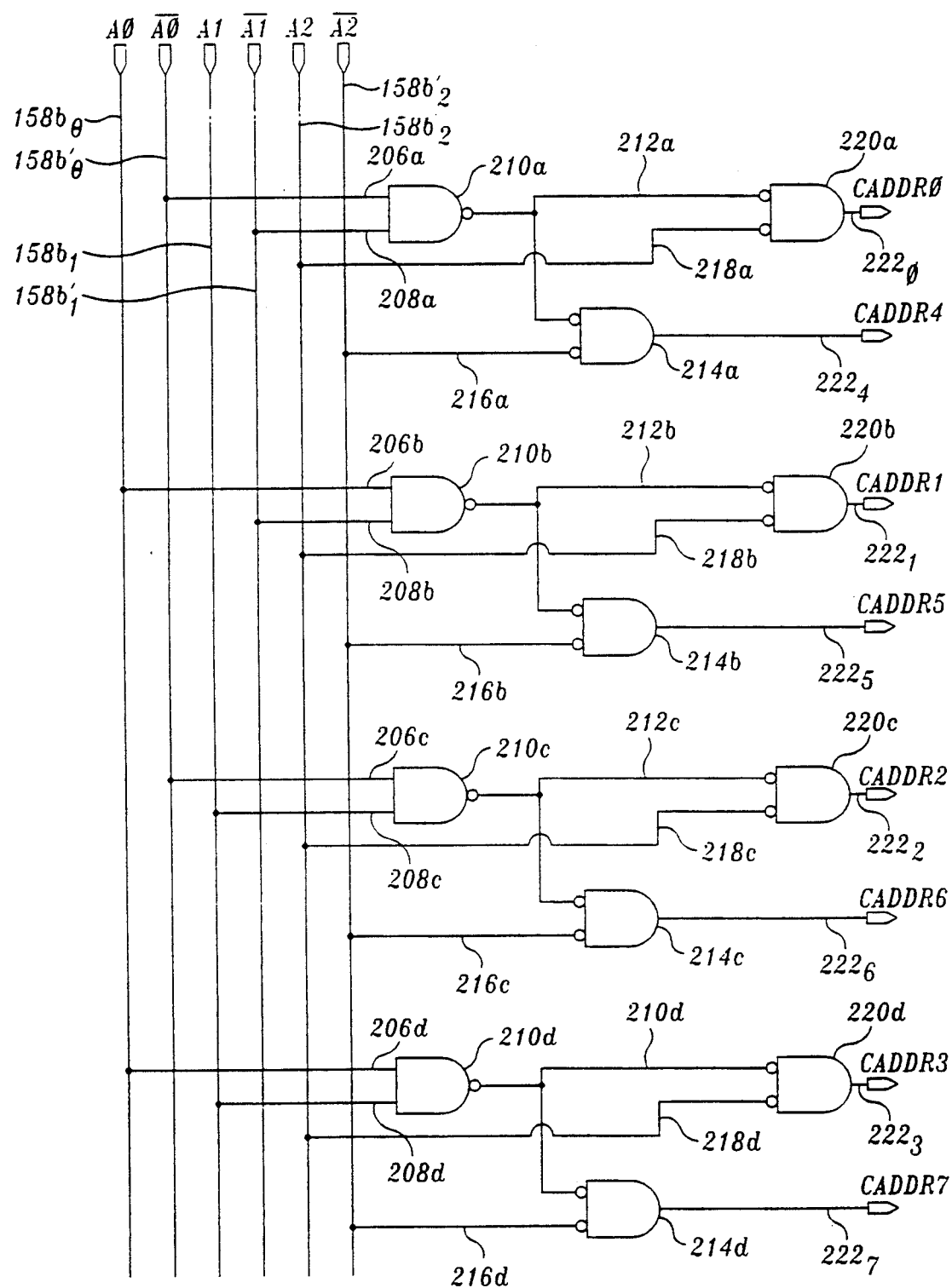
FIG. 11A is a representative schematic diagram of circuitry used to select a column in one group for storage or retrieval of bit slice data.
Figure 11B:
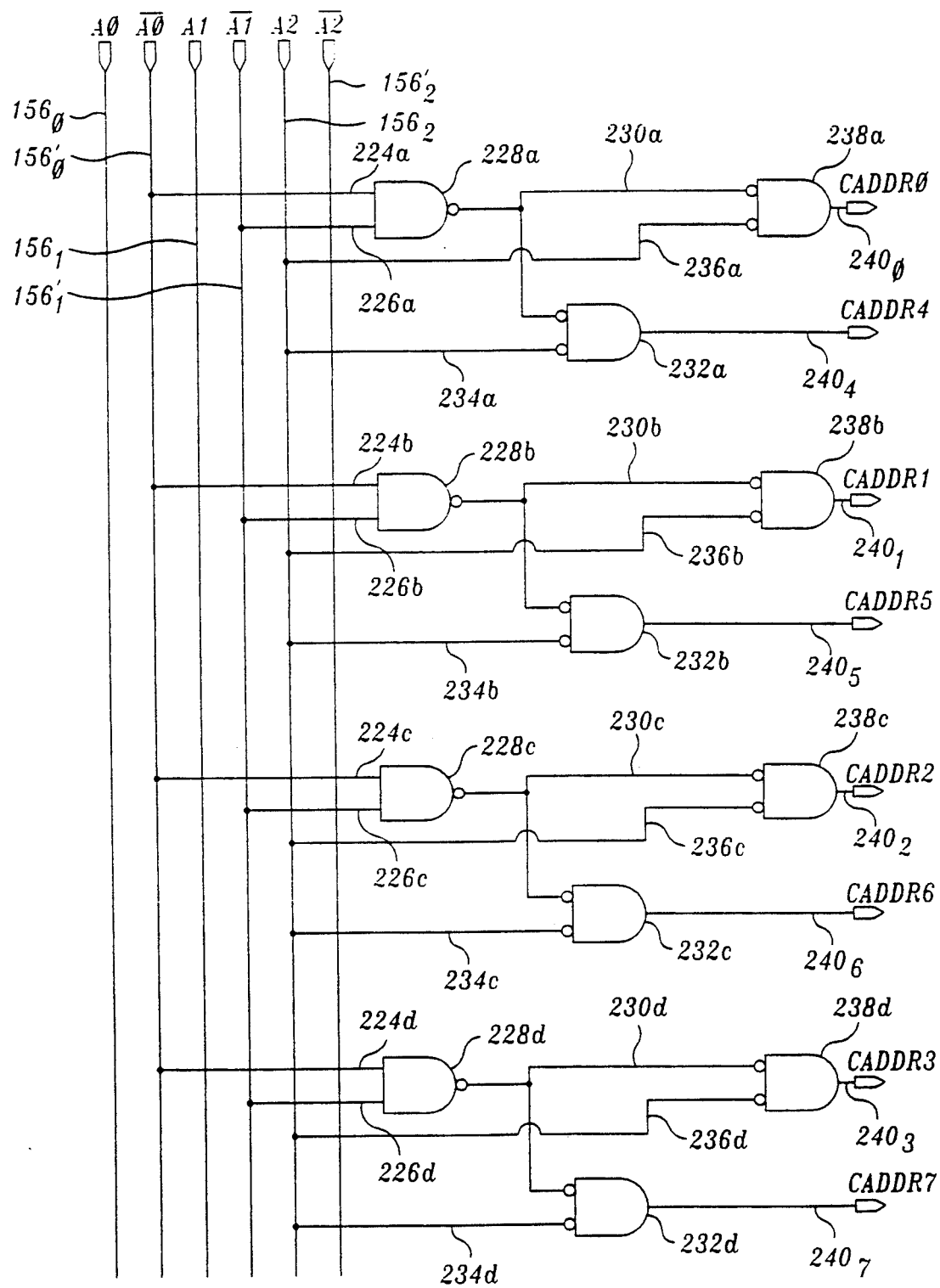
FIG. 11B is a representative schematic diagram of circuitry used to select all columns in one group for storage or retrieval of pixel data.

Circuitry used to develop a column selection signal (one of the signals CADDR0 through CADDR7) on lines 222 that designate the specific column selected for storage or retrieval of one bit of the bit slice data is shown in FIG. 11A, while the corresponding circuitry used to determine the column selection signals of the selected group that are conveyed on lines 240, for storing and retrieving pixel data, is shown in FIG. 11B. Referring first to FIG. 11A, bit plane addresses on bit plane address bus lines $158b_0$ through $158b_2$ and their corresponding complements on bit plane address bus lines $158b'_0$ through $158b'_2$ are input to NAND gates 210, and to inverted input AND gates 214 and 220. Specifically, NAND gate 210a has one input connected by a line 206a to inverted bit plane address (zero bit) bus line $158b'_0$ and another input connected by a line 208 to the inverted bit plane address (one bit) bus line $158b'_1$. The output of NAND gate 210a is conveyed through a line 212a to one input of an inverted input AND gate 220a, the other inverted input being connected through a line 218a to the second address bit on bit plane address bus line $158b_2$. The output of NAND gate 210a is also connected to one input of an inverted input AND gate 214a, the other inverted input being connected by a lead 216a to the inverted second bit of the bit plane address on bit plane address bus line $158'_2$. The output of inverted input AND gate 214a is connected to a line $220_4$ and is used to select the fourth column in a group for the bit slice data.

Similarly, a NAND gate 210b has one input connected by a line 206b to the bit plane address (zero bit) bus line $158b_0$ and its second input connected by a line 208b to the inverted bit plane address (bit one) bus line $158b'_1$. The output of NAND gate 210b is conveyed on a line 212b to one input of inverted input AND gate 220b, the other input being coupled over a line 218b to bit plane address (second bit) bus line $158b_2$. The column select signal (CADDR1) from inverted input AND gate 220b is conveyed on a line $222_1$. Line 212b is also connected to an inverted input of inverted input AND gate 214b, the other input being coupled through a line 216b to the inverted bit plane address (second bit) bus line $158b'_2$. A fifth column select signal (CADDR5) output from inverted input AND gate 214b is conveyed on a line $220_5$. In like manner, the second, sixth, third, and seventh column select signals (CADDR2, CADDR3, CADDR6, and CADDR7) are developed by the other gates 210, 214, and 220 shown in FIG. 11A, each of which have their inputs selected to different combinations of bit plane address bits and their corresponding inverted complements.

Referring now to FIG. 11B, circuitry is shown for decoding the pixel addresses to select a group of eight columns in response to the three pixel address bits conveyed on pixel address bus lines $156_0$ through $156_2$, and their corresponding inverted complements on pixel address bus lines $156'_0$ through $156'_2$. This circuitry is generally similar to that shown in FIG. 11A; however, different pixel address bits are used to control gates 228, 232, and 238 in order to select all eight columns in a group. Specifically, a NAND gate 228a has one of its inputs coupled through a line 224a to the inverted zero pixel address (bit zero) bus line $156'_0$ and its other input connected via a line 226a to the inverted bit one pixel address (bit one) bus line. The output of NAND gate 228a is connected through a line 230a to one input of an inverted input AND gate 238a, the other inverted input being connected by a line 236a to the pixel address (bit two) bus line $156_2$. Assuming that both inputs to NAND gate 228a are high, it has a logic level 0 on its output;

otherwise, its output is at a logic level 1. If both signals applied to the inputs of inverted input AND gate 238a are at a logic level 0, its output on a line $240_0$ is at a logic level 1. The output of NAND gate 228a is also input to an input of an inverted input AND gate 232a, the other input being connected by a line 234a to the pixel address (bit two) bus line $156_2$. With two logic level zero inputs, inverted input AND gate 232a produces a logic level 1 on a line $240_4$ to select the fourth column of the group. In the same fashion, each of the remaining gates 228, 232, and 238 are connected to selected ones of the three pixel address bits on lines $156_0$ through $156_2$ (and their complements) to select all eight columns in a specific group as a function of bits 0 through 2 of the pixel address.

Figure 12:
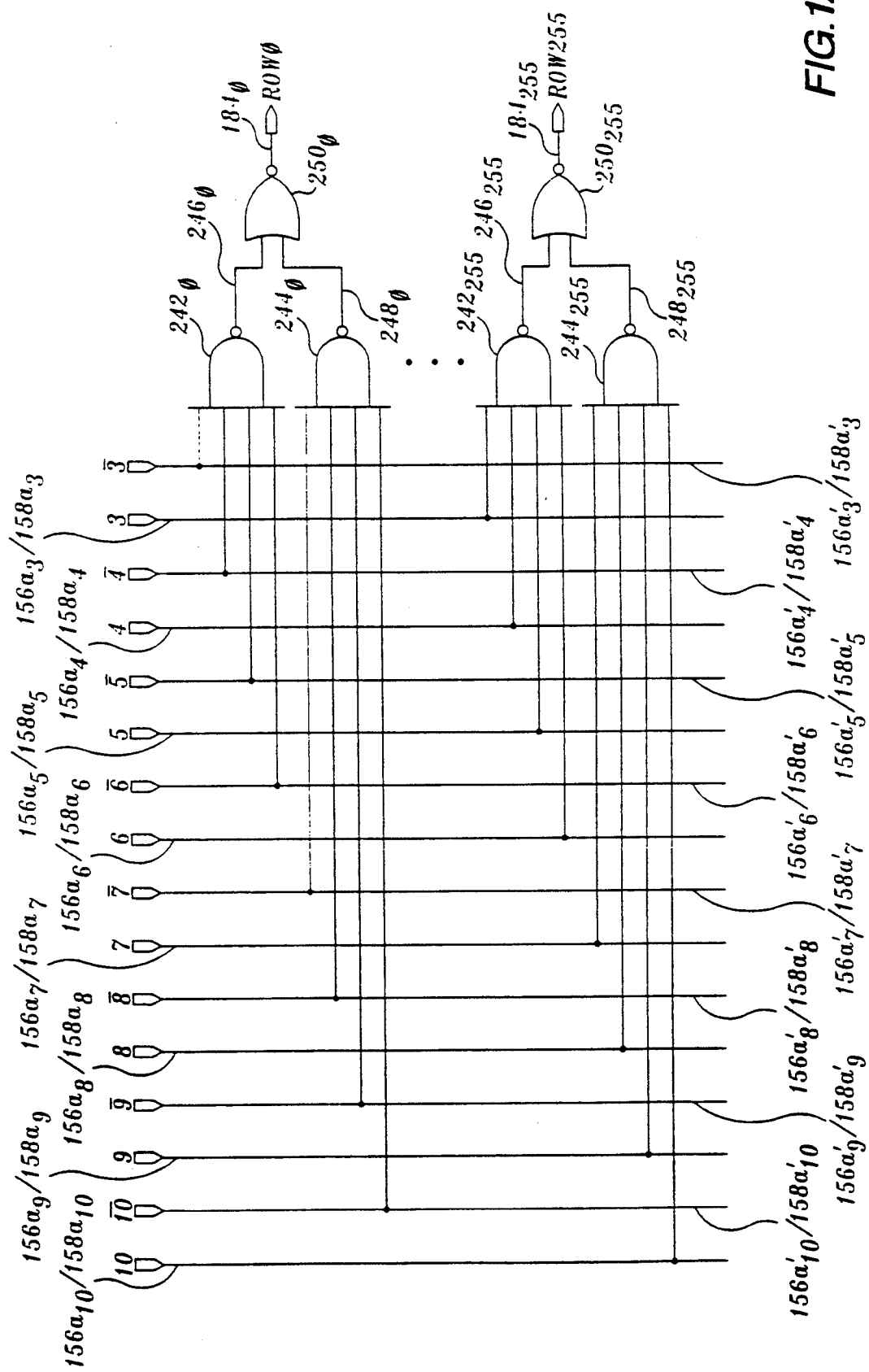
FIG. 12 is a representative schematic diagram of a circuit used to select a row in the blocks of memory cells.

Selection of the rows for each of the upper and lower memory blocks during operation of the preferred embodiment of memory circuit 30 in either the bit plane or pixel mode is accomplished with row decoders employing the circuit shown in FIG. 12. In FIG. 12, only the circuitry required to decode the zero and 255th row is illustrated, selection of any one of the remaining rows being accomplished in an equivalent manner based upon specific connections of the row decoder circuitry to pixel/bit plane address bits 3 through 10 and their complements. Each of the row selection bit plane/pixel address bits are conveyed on bit plane/pixel address bus lines $156a_j/158a_j$ (where j equals 4 through 10), and corresponding complement bits are conveyed on bit plane/pixel address bus lines $156a'_j/158a'_j$.

The row decoder for row 0 includes a four input NAND gate $242_0$ and a four input NAND gate $244_0$. The inputs to NAND gate $242_0$ are connected to the inverted third, fourth, fifth, and sixth address bits on bit plane/pixel address bus lines $156a'_3/158a'_3$ through $156a'_6/158a'_6$. Similarly, the four inputs to NAND gate $244_0$ are connected to the inverted bits 7, 8, 9, and 10 on bit plane/pixel address bus lines $156a'_7/158a'_7$ through $156a'_{10}/158a'_{10}$. If all four inputs to NAND gates $242_0$ and $244_0$ are at logic level 1, the outputs of both of these NAND gates will be at logic level 0; otherwise, one or both of the outputs will be at logic level 1. Lines $246_0$ and $248_0$ convey the respective outputs of the two NAND gates $242_0$ and $248_0$ to the inputs of a NOR gate $250_0$. If either input of NOR gate $250_0$ is a logic level 1, its output is a logic level 0; otherwise, it is a logic level 1. The output of NOR gate $250_0$ selects row 0, if it is a logic level 1. Similarly, each of the other row decoder circuits is connected to different ones of the address lines, thereby selecting only one of the 256 rows, depending upon the specific logic level of bit plane/pixel address bits 3 through 10. Thus, row 255 is selected if all four inputs to NAND gates $242_{255}$ and to NAND gate $244_{255}$ are at logic level 0, since the output of NOR gate $250_{255}$ is then a logic level 1.

Figure 13:
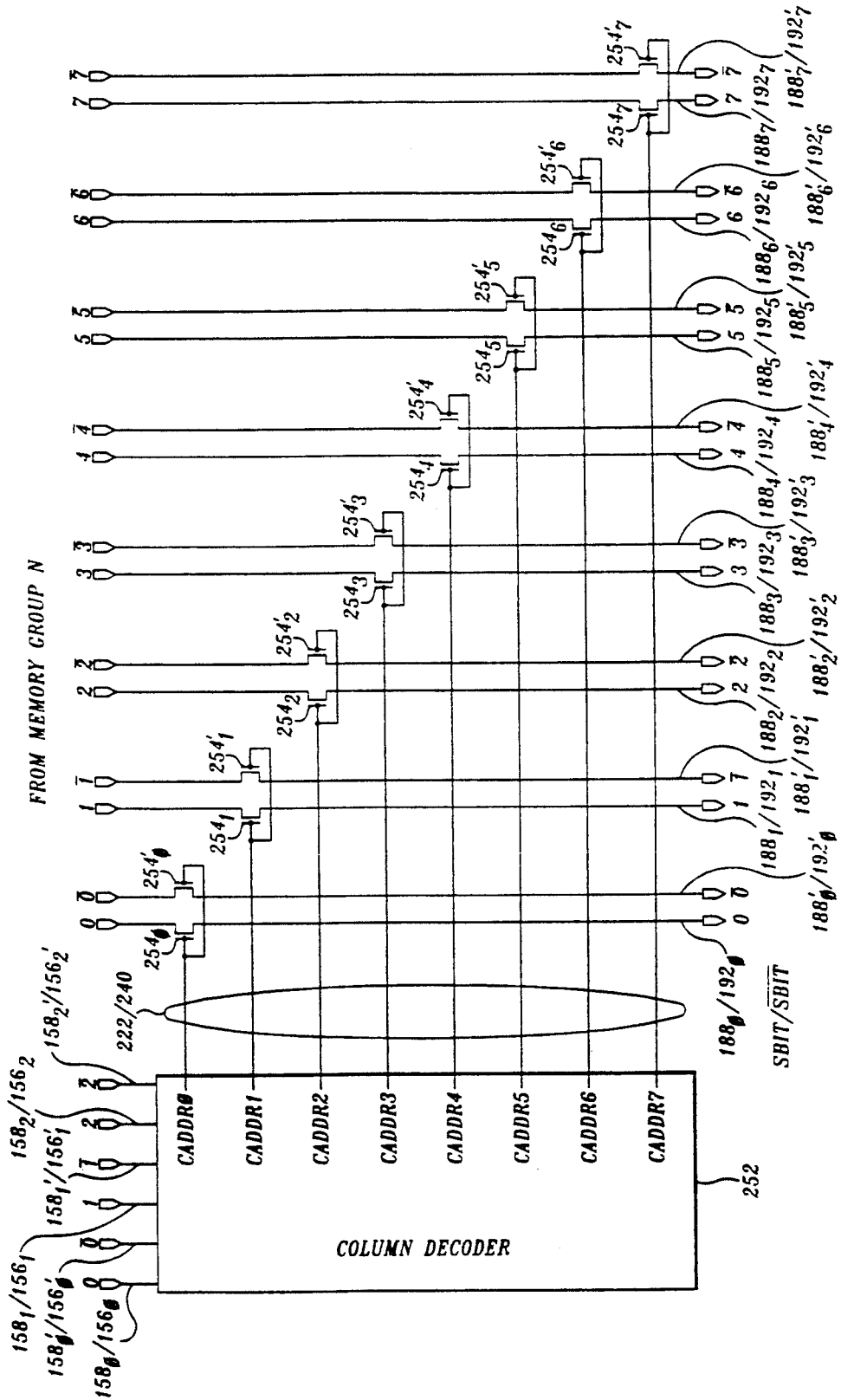
FIG. 13 is a representative schematic diagram of a column selection circuit for storing or reading either pixel or bit slice data.

In FIG. 13, the column decoder circuitry used to select a single column during operation in the bit plane mode and to select all eight columns in a group during operation in the pixel mode is illustrated with respect one group of columns. In this Figure, the first three bit plane address bits conveyed on bit plane address bus lines $156_0$ through $156_2$ and their corresponding complements on $156'_0$ through $156'_2$ are input to column decoder 252, causing it to select a single column during operation in the bit plane mode (reference FIG. 11A). If the three pixel address bits on pixel address bus lines $158_0$ through $158_2$ and their corresponding complements on pixel address bus lines $158'_0$ through $158'_2$ have the required logic levels, all eight columns are selected (reference FIG. 11B).

When operating in the bit plane mode, only one of the column selection signals (CADDR0 through CADDR7) on lines 222 is selected, i.e., has a logic level 1 on its output. (Compare this condition to operation in the pixel mode, wherein all of the columns in a group are selected as a function of the column select signals on lines 240.) The specific column selected, as previously explained, is determined by the bit plane address bits 0 through 2 on bit plane address bus lines $158_0$ through $158_2$ and $158'_0$ through $158'_2$.

The signals on lines 222 or 240 select a column by turning on NMOS pass gates switches $254_0$ through $254_7$ and $254'_0$ through $254'_7$. For example, during operation in the bit plane mode, if column select signal CADDR2 is set, line $222_2$ energizes FET switch $254_2$ and the corresponding FET switch $254'_2$ for bit slice data bus line $188'_2$. Corresponding switches are used to select the same column in each of the other groups comprising both the lower and upper memory blocks 32a and 32b. In the pixel mode, all eight column select signals are energized to turn on each of the FET switches 254 and 254' so that all eight columns in a group are selected for the pixel on a given row in the left and right portions of the lower and upper memory blocks.

While the present invention has been defined with respect to a preferred embodiment, those of ordinary skill in the art will appreciate that many changes may be made to the dual port, three-dimensional memory embodied in memory circuit 30 within the scope of the claims that follow. For example, although the preferred embodiment is disclosed as a dual port, three-dimensional memory array, it should be apparent to those of ordinary skill that memory circuit 30 can readily be modified to provide an N−1 port, N-dimensional memory array (N>3), thereby extending the technique explained above to a more general configuration. Of course, additional address lines would be required to select each additional dimension in an N-dimensional array (with N>3). For example, a four-dimensional array is implemented by providing three ports for data selected by addressing the specific three coordinates of each data type, thereby defining a storage address for each bit of data that is to be input or output on the three ports. These and other changes to the preferred embodiment of the invention are encompassed by the scope of the claims that follow. The scope of the invention thus should not be in any way limited by the disclosure of the preferred embodiments and modifications thereto, but instead should be determined entirely by reference to the claims that follow.

The embodiments of the invention in which an exclusive property or privilege is claimed are defined as follows:

1. A memory circuit, in which data are accessed as if stored in an array of at least three dimensions, comprising:
   (a) a plurality of memory elements, each memory element storing at least one bit of data, the memory elements being logically organized in a plurality of sets of parallel memory planes in said array, the parallel memory planes in each set being logically orthogonal to the parallel memory planes in the other sets;
   (b) a plurality of address busses, each address bus conveying addresses for memory elements in one of the logically orthogonal sets of parallel memory planes;

(c) data port means for conveying data to and from those memory elements selected by the addresses conveyed on the address busses; and (d) control means for controlling access of the data port means to the memory elements in accordance with the addresses supplied on the address busses and operative to effect storage and retrieval of data from the memory elements in the logically orthogonal sets of parallel memory planes, wherein the control means prevent simultaneous storage of data into any one of the memory elements that is common to two of the logically orthogonal sets of parallel memory planes.

2. The memory circuit of claim 1, wherein the data port means comprise at least two ports and each of the at least two ports provides access to and from a different one of the logically orthogonal sets of parallel memory planes, the location of each of the memory elements in the array being defined by a row, a column, and a bit plane in which the memory element is disposed.

3. The memory circuit of claim 2, wherein the data port means convey data to and from selected ones of the memory elements that are at locations defined by a row address and a column address, and to and from selected ones of the memory elements that are at locations defined by a row address and a bit plane address.

4. The memory circuit of claim 3, wherein at least one port of the data port means comprises a pixel port and at least another port of the data port means comprises a bit plane port, and wherein said control means are further operative to allow a number, p, of selected ones of the memory elements comprising a pixel to be accessed for storage or retrieval through the pixel port, and a number, b, of selected ones of the memory elements, each comprising a bit plane element, to be accessed for storage or retrieval through the bit plane port.

5. The memory circuit of claim 2, wherein data are transferred through a selected one of the at least two ports at a time.

6. The memory circuit of claim 1, wherein data stored and retrieved from at least one of the logically orthogonal sets of parallel memory planes are transferable through the data port means in a parallel data stream.

7. The memory circuit of claim 1, wherein data stored and retrieved from selected ones of the memory elements in the logically orthogonal sets of parallel memory planes are transferable through all of the data port means in a parallel data stream.

8. The memory circuit of claim 2, wherein said at least two ports provide independent access to the same data.

9. The memory circuit of claim 4, wherein the data stored in the memory elements represent an image.

10. The memory circuit of claim 1, wherein the memory elements are physically disposed in a plurality of separate blocks and the control means include addressing means for controlling access of the data port means to the memory elements of each block by multiplexing an address between the plurality of separate blocks, disposition of the memory elements into said separate blocks enhancing an access speed for reading and writing data to the memory elements.

11. An integrated circuit for storing and accessing data represented as if stored in an N-dimensional array, comprising:

(a) data storage means for selectively writing the data at specified locations in the circuit, where the locations are uniquely defined by N coordinates so that the data are represented as being stored in one of a plurality of memory planes comprising the N-dimensional array, the memory planes being organized as logically orthogonal sets of memory planes, whereby the data can subsequently be retrieved and read from said specified locations;

(b) address means for identifying each of said specified locations with a plurality of the coordinates that comprise an address identifying a location in one of the memory planes in the logically orthogonal sets of memory planes;

(c) input/output means, including a plurality of ports each of which conveys data to and from the data storage means, for storage and retrieval at the specified locations identified by the coordinates; and (d) multiplexing means for controlling access of the input/output means to the data in accordance with the addresses of the data so that each port conveys data for a different set of the logically orthogonal sets of memory planes.

12. The integrated circuit of claim 11, wherein the multiplexing means prevent data from different ports being simultaneously written to a particular location in the data storage means.

13. The integrated circuit of claim 11, wherein N equals three and the input/output means include at least two ports.

14. The integrated circuit of claim 13, wherein one of the two ports conveys data to and from the specified locations for one set of the logically orthogonal sets of memory planes and the other port conveys data to and from the specified locations for another set of the logically orthogonal sets of memory planes.

15. The integrated circuit of claim 13, wherein both ports convey data in a parallel format to and from the specified locations for each set of the logically orthogonal sets of memory planes.

16. The integrated circuit of claim 13, wherein the data written into the data storage means represents an image and one of the two ports conveys pixel data and the other of the two ports conveys bit plane data for the image.

17. The integrated circuit of claim 16, wherein the addresses for the pixel data that are conveyed through said one of the two ports define the specified location in one of the memory planes by a row and a column address, and the addresses for the bit plane data that are conveyed through said other port define the specified location in another of the memory planes by a row and a bit plane address.

18. The integrated circuit of claim 16, wherein the data storage means comprise a plurality of memory cells, each memory cell storing one bit of data, said pixel data comprising p bits of data that are writeable and readable in a parallel format, and said bit plane data comprising b bits of data that are writeable and readable in parallel format.

19. The integrated circuit of claim 11, wherein data are simultaneously conveyed to and from the data storage means through at least two ports.

20. The integrated circuit of claim 11, wherein data are conveyed to and from the data storage means through only one of the plurality of ports at a time.

21. The integrated circuit of claim 11, wherein the locations to which data are written are physically disposed in a plurality of separate blocks; and wherein the multiplexing means include addressing means for writing and retrieving the data from the separate blocks, the speed with which the data are written and retrieved being thereby enhanced.

22. A dual port memory integrated circuit, wherein data are represented as being organized and stored in a three-dimensional array, comprising:

(a) a plurality of random access memory cells;

(b) a first port for conveying data stored in the random access memory cells from the integrated circuit;

(c) a second port for conveying data stored in the random access memory cells from the integrated circuit;

(d) a first address bus that conveys first port addresses, each first port address identifying a specific random access memory cell in terms of coordinates defining a location in a first set of planes represented as being parallel to each other;

(e) a second address bus that conveys second port addresses, each second port address identifying a specific random access memory cell in terms of coordinates defining a location in a second set of planes represented as being parallel to each other and logically orthogonal to the first set of planes in the three-dimensional array; and (f) read enable means for controlling the times at which the data stored in the random access memory cells of the first and the second set of planes are read and conveyed through the first and the second ports.

23. The dual port memory integrated circuit of claim 22, wherein the first port conveys data from locations within each of the first set of planes at addresses defined by a row and a column, and wherein the second port conveys data from locations within each of the second set of planes at addresses defined by a row and a bit plane.

24. The dual port memory integrated circuit of claim 22, wherein the first port conveys data, p bits at a time, and the second port conveys data, b bits at a time.

25. The dual port memory integrated circuit of claim 23, wherein the first and the second ports convey data into the integrated circuit for storage at specified random access memory cells in the first and the second set of planes, respectively, said specified locations being defined by the first and the second port addresses respectively conveyed on the first and the second address busses, and write enable means for controlling the times at which the data are conveyed to the specified locations and stored therein.

26. The dual port memory integrated circuit of claim 22, wherein the data stored in the random access memory means represent an image, said data conveyed through the first port representing pixels of the image, and the second port conveying data representing bit planes of the image.

27. The dual port memory integrated circuit of claim 22, wherein both of the ports convey data in a parallel format.

28. The dual port memory integrated circuit of claim 22, wherein the plurality of random access cells are disposed in a plurality of physically separate blocks, the first and second port address determining which of the separate blocks are addressed when the data are stored and read, thereby enhancing the speed with which the data are stored and read.

* * * * *

UNITED STATES PATENT AND TRADEMARK OFFICE
CERTIFICATE OF CORRECTION

PATENT NO. : 5,303,200
DATED : April 12, 1994
INVENTOR(S) : S. E. Elrod et al.

It is certified that error appears in the above-indentified patent and that said Letters Patent is hereby corrected as shown below:

| COLUMN | LINE | |
|---|---|---|
| Title page, item [57] "Abstract" | 1 | "three dimensional" should read --three-dimensional-- |
| 2 | 33 | "part" should read --port-- |
| 20 (Claim 25, | 8 & 9 Lines 1 & 2) | "claim 23" should read --claim 22-- |

Signed and Sealed this

Sixth Day of September, 1994

Attest:

BRUCE LEHMAN

*Attesting Officer*     *Commissioner of Patents and Trademarks*